(12) United States Patent
Yamamoto

(10) Patent No.: US 10,283,527 B2
(45) Date of Patent: May 7, 2019

(54) METHOD OF MANUFACTURING SEMICONDUCTOR DEVICE

(71) Applicant: Renesas Electronics Corporation, Koutou-ku, Tokyo (JP)

(72) Inventor: Yoshiki Yamamoto, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/917,607

(22) Filed: Mar. 10, 2018

(65) Prior Publication Data

US 2018/0342537 A1 Nov. 29, 2018

(30) Foreign Application Priority Data

May 29, 2017 (JP) .................................. 2017-105973

(51) Int. Cl.
| | | |
|---|---|---|
| H01L 27/12 | (2006.01) | |
| H01L 21/84 | (2006.01) | |
| H01L 29/66 | (2006.01) | |
| H01L 21/265 | (2006.01) | |
| H01L 29/423 | (2006.01) | |

(Continued)

(52) U.S. Cl.
CPC ...... *H01L 27/1207* (2013.01); *H01L 21/2253* (2013.01); *H01L 21/26513* (2013.01); *H01L 21/26586* (2013.01); *H01L 21/324* (2013.01); *H01L 21/823418* (2013.01); *H01L 21/84* (2013.01); *H01L 29/167* (2013.01); *H01L 29/42364* (2013.01); *H01L 29/42376* (2013.01); *H01L 29/6659* (2013.01);
(Continued)

(58) Field of Classification Search
CPC ........... H01L 27/1207; H01L 29/66628; H01L 29/7834; H01L 21/823418; H01L 29/167; H01L 21/324; H01L 21/2253; H01L 21/26586; H01L 21/26513; H01L 29/42376; H01L 29/42364; H01L 29/6659; H01L 21/84; H01L 29/7833; H01L 21/823814
See application file for complete search history.

(56) References Cited

U.S. PATENT DOCUMENTS

2013/0264644 A1* 10/2013 Tsunomura ......... H01L 27/1203
257/350

FOREIGN PATENT DOCUMENTS

| JP | 2010-251639 A | 11/2010 |
|---|---|---|
| JP | 2013-219181 A | 10/2013 |

* cited by examiner

*Primary Examiner* — Karen Kusumakar
(74) *Attorney, Agent, or Firm* — Shapiro, Gabor and Rosenberger, PLLC

(57) ABSTRACT

An SOI substrate having a semiconductor substrate, an insulating layer formed on the semiconductor substrate, and a semiconductor layer formed on the insulating layer is provided. A first region is one for forming a low breakdown voltage MISFET in the semiconductor layer, and a second region, in which the insulating layer and the semiconductor layer have been removed, is one for forming a high breakdown voltage MISFET. After an n-type semiconductor region is formed in the second region and an n-type extension region is formed in the first region, a first heat treatment is performed on the semiconductor substrate. Thereafter, a diffusion layer is formed in each of the first and second regions, and then a second heat treatment is performed on the semiconductor substrate. Herein, the time for which the first heat treatment is performed is longer than the time for which the second heat treatment is performed.

15 Claims, 20 Drawing Sheets

(51) Int. Cl.
*H01L 21/225* (2006.01)
*H01L 29/78* (2006.01)
*H01L 29/167* (2006.01)
*H01L 21/324* (2006.01)
*H01L 21/8234* (2006.01)
*H01L 21/8238* (2006.01)

(52) U.S. Cl.
CPC .... *H01L 29/66628* (2013.01); *H01L 29/7833* (2013.01); *H01L 29/7834* (2013.01); *H01L 21/823814* (2013.01)

METHOD OF MANUFACTURING SEMICONDUCTOR DEVICE

CROSS-REFERENCE TO RELATED APPLICATIONS

The disclosure of Japanese Patent Application No. 2017-105973 filed on May 29, 2017 including the specification, drawings and abstract is incorporated herein by reference in its entirety.

BACKGROUND

The present invention relates to a method of manufacturing a semiconductor device, and to a technique effective when applied, for example, to a manufacturing technique of a semiconductor device using an SOI substrate.

One of the characteristics required of a MISFET (Metal Insulator Semiconductor Field Effect Transistor) formed on a semiconductor substrate is to reduce leakage current. In a MISFET having a gate length of 90 nm or less, it is particularly important to suppress GIDL (Gate Induced Drain Leakage), one of the items of leakage current. For example, Patent Document 1 discloses, as measures against leakage current due to such GIDL, a technique in which an extension region is separately formed in a region having a high concentration that is formed at a deep position and a region having a low concentration that is formed at a shallow position.

Meanwhile, there is a technique of forming a MISFET on an SOI (Silicon On Insulator) substrate, as a semiconductor device for low power consumption. For example, Patent Document 2 discloses a technique in which a MISFET formed on an SOI substrate and a MISFET formed on a semiconductor substrate are separately formed in the same semiconductor chip.

RELATED ART DOCUMENT

Patent Document

[Patent Document 1] Japanese Unexamined Patent Application Publication No. 2010-251639

[Patent Document 2] Japanese Unexamined Patent Application Publication No. 2013-219181

SUMMARY

Even in a semiconductor device in which a MISFET is formed on an SOI substrate, it is desired to adopt measures against leakage current due to GIDL. In addition, it is desired to suppress leakage current due to GIDL without lowering the on-current of a MISFET. That is, it is desired to achieve both the reliability and performance of a semiconductor device in which a MISFET is formed on an SOI substrate.

Other problems and new characteristics will become clear from the description and accompanying drawings of the present specification.

According to one embodiment, a method of manufacturing a semiconductor device includes the step of (a) providing a semiconductor substrate, an insulating layer formed on the semiconductor substrate, and a first semiconductor layer formed on the insulating layer. The method further includes the step of (b) removing the insulating layer in a second region and the first semiconductor layer in the second region, while leaving the insulating layer in a first region and the first semiconductor layer in the first region, wherein the second region in which a second MISFET is to be formed is a different region from the first region in which a first MISFET is to be formed. The method further includes the step of (c) after the step (b), forming a first semiconductor region having an n-type conductivity in the semiconductor substrate in the second region by an ion implantation process. The method further includes the step of (d) after the step (b), forming a first extension region having an n-type conductivity in the first semiconductor layer in the first region by an ion implantation process. The method further includes the step of (e) after the steps (c) and (d), performing a first heat treatment on the semiconductor substrate. The method further includes the step of (f) after the step (e), forming a second diffusion layer having a higher concentration than the first semiconductor region and having an n-type conductivity in the semiconductor substrate in the second region by an ion implantation process. The method further includes the step of (g) after the step (e), forming a first diffusion layer having a higher concentration than the first extension region and having an n-type conductivity in the first semiconductor layer in the first region by an ion implantation process. The method further includes the step of (h) after the steps (f) and (g), performing a second heat treatment on the semiconductor substrate. The time for which the first heat treatment is performed is longer than the time for which the second heat treatment is performed.

According to the one embodiment, both the reliability and performance of a semiconductor device can be achieved.

DETAILED DESCRIPTION

Figure 1:
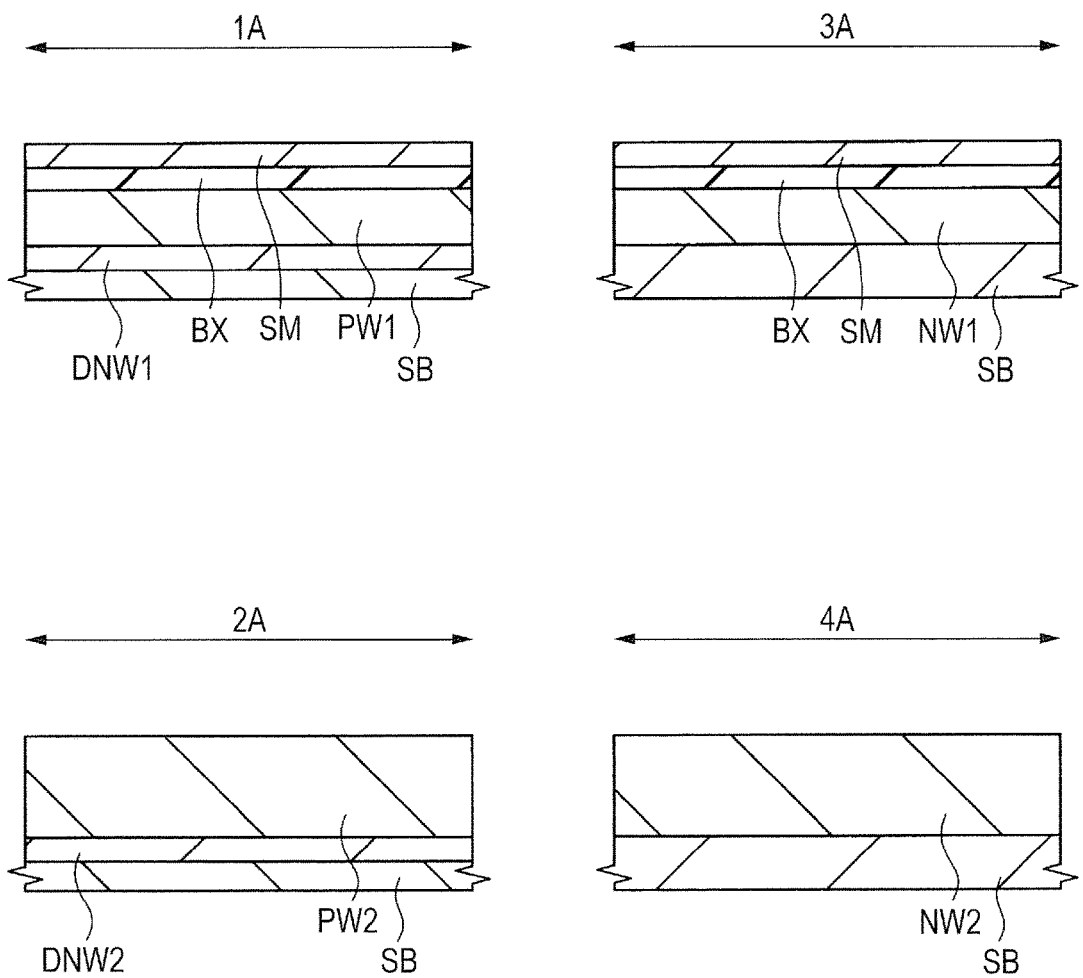
FIG. 1 is a main part sectional view illustrating a manufacturing step of a semiconductor device according to one embodiment.

When necessary for convenience in the following embodiments, description is given by dividing the embodiment into a plurality of sections or embodiments; however, unless expressly stated otherwise, they are not independent of one another, but one is related with part or the whole of another as a variation, a detail, supplementary description, etc. When the numbers of elements, etc. (including numbers of pieces, numerical values, amounts, ranges, etc.) are referred to in the following embodiments, the numbers are not limited to the specific ones but may be more or less than the specific numbers, unless expressly stated otherwise or except when the numbers are obviously limited to the specific numbers in principle. Further, in the following embodiments, it is needless to say that the components (also including constituent steps, etc.) are not necessarily requisite unless expressly stated otherwise or except when they are obviously requisite in principle. Similarly, in the following embodiments, when the shapes and positional relations, etc., of the constituent elements, etc., are referred to, those substantially the same as or similar to the shapes, etc., should be included, unless expressly stated otherwise or except when considered to be clearly otherwise in principle. This also applies to the above numerical values and ranges.

Hereinafter, preferred embodiments will be described in detail based on the accompanying views. In each view for explaining the embodiments, components having the same function will be denoted with the same reference numerals, and duplicative description thereof will be omitted. In the following embodiments, description of the same or similar parts will not be repeated in principle, unless particularly necessary.

In the views used in the embodiments, hatching may be omitted in order to make them easier to see.

Embodiment

<Manufacturing Steps of Semiconductor Device>

Manufacturing steps of a semiconductor device according to the present embodiment will be described with reference to FIGS. 1 to 15.

In the present embodiment, an example will be described in which an n-type low breakdown voltage MISFET Q1, a p-type low breakdown voltage MISFET Q3, an n-type high breakdown voltage MISFET Q2, and a p-type high breakdown voltage MISFET Q4 are formed on the same semiconductor substrate SB.

Herein, the MISFETs Q1 and Q3 are transistors capable of operating faster than the MISFETs Q2 and Q4, and are used in logic circuits, SRAMs (Static Random Access Memories), or the like. The MISFETs Q2 and Q4 are transistors each having a higher breakdown voltage than the MISFETs Q1 and Q3, and are used in input/output protection circuits or the like. The gate lengths of the MISFETs Q1 and Q3 and the thicknesses of the gate insulating films thereof are smaller than the gate lengths of the MISFETs Q2 and Q4 and the thicknesses of the gate insulating films thereof, respectively. The gate lengths of the MISFETs Q1 and Q3 are 90 nm or less.

A region 1A illustrated in FIGS. 1 to 15 is one where the MISFET Q1 is to be formed, a region 2A is one where the MISFET Q2 is to be formed, a region 3A is one where the MISFET Q3 is to be formed, and a region 4A is one where the MISFET Q4 is to be formed.

The processes up to the structure illustrated in FIG. 1 will be briefly described. First, a so-called SOI substrate having a semiconductor substrate SB that is a supporting substrate, an insulating layer BX formed on the semiconductor substrate SB, and a semiconductor layer SM formed on the insulating layer BX is provided.

The semiconductor substrate SB includes single crystal silicon preferably having a specific resistance of approximately 1 to 10 $\Omega$ cm, and includes, for example, p-type single crystal silicon. The insulating layer BX includes, for example, silicon oxide, and the thickness thereof is, for example, approximately 10 to 20 nm. The semiconductor layer SM includes single crystal silicon preferably having a specific resistance of approximately 1 to 10 $\Omega$ cm, and the thickness thereof is, for example, approximately 10 to 20 nm. Herein, impurities are not introduced into the semiconductor layer SM by ion implantation or the like.

There is no limitation on the manufacturing method of the SOI substrate, but it can be manufactured by, for example, an SIMOX (Separation by IMplanted Oxygen) method. In the SIMOX method, oxygen ($O_2$) is ion-implanted with high energy into a semiconductor substrate including silicon (Si), so that silicon and oxygen are combined with each other by a subsequent heat treatment, whereby the insulating layer BX including silicon oxide is formed at a position slightly deeper than the surface of the semiconductor substrate. In this case, a thin film of silicon remaining on the insulating layer BX becomes the semiconductor layer SM, and the semiconductor substrate under the insulating layer BX becomes the semiconductor substrate SB. Alternatively, the SOI substrate may be formed by a bonding method. In the bonding method, after the insulating layer BX is formed by, for example, oxidizing the surface of a first semiconductor substrate including silicon, a second semiconductor substrate including silicon is pressure-bonded to the first semiconductor substrate at a high temperature, and thereafter the second semiconductor substrate is thinned. In this case, the thin film of the second semiconductor substrate remaining on the insulating layer BX becomes the semiconductor layer SM, and the first semiconductor substrate under the insulating layer BX becomes the semiconductor substrate SB. The SOI substrate can also be manufactured by using other methods, for example, a smart-cut process.

Subsequently, a trench is formed to penetrate the semiconductor layer SM, the insulating layer BX, and the semiconductor substrate SB, and an element isolation portion (not illustrated) is formed by burying an insulating film in the trench. The regions 1A to 4A are isolated from each other by the element isolation portion.

Subsequently, by using a photolithography process and an ion implantation process, an n-type well DNW1 is formed in the semiconductor substrate SB in the region 1A and a p-type well PW1 is formed in the well DNW1. The well PW1 is a region that functions as a gate of the MISFET Q1 together with the later-described gate electrode G1, and is a region for controlling a threshold value of the MISFET Q1 by applying a voltage independent of the gate electrode G1 to the well PW1. In order to apply a voltage to the well PW1, part of each of the semiconductor layer SM and the insulating layer BX in the region 1A is removed to expose the well PW1, so that the exposed well PW1 is allowed to serve as a power supply region, but description of the power supply region is omitted herein. In addition, a p-type impurity region having a higher concentration than the well PW1 may be formed in the surface of the well PW1 in contact with the insulating layer BX.

Subsequently, an n-type well NW1 is formed in the semiconductor substrate SB in the region 3A by using a photolithography process and an ion implantation process. The well NW1 is a region that functions as a gate of the MISFET Q3 together with the later-described gate electrode G3, and is a region for controlling a threshold value of the MISFET Q3 by applying a voltage independent of the gate electrode G3 to the well NW1. In order to apply a voltage to the well NW1, part of each of the semiconductor layer SM and the insulating layer BX in the region 3A is removed to expose the well NW1, so that the exposed well NW1 is allowed to serve as a power supply region, but description of the power supply region is omitted herein. In addition, an n-type impurity region having a higher concentration than the well NW1 may be formed in the surface of the well NW1 in contact with the insulating layer BX.

Herein, ion implantation, aimed at adjusting a threshold value or the like, is not performed on the semiconductor layer SM in each of the regions 1A and 3A, and hence impurities are not introduced.

Subsequently, by using a photolithography process and an ion implantation process, an n-type well DNW2 is formed in the semiconductor substrate SB in the region 2A, and a p-type well PW2 is formed in the well DNW2. Next, an n-type well NW2 is formed in the semiconductor substrate SB in the region 4A by using a photolithography process and an ion implantation process.

In addition, ion implantation, aimed at adjusting a threshold value or the like, may be performed on the semiconductor substrate SB in each of the regions 2A and 4A.

Subsequently, the semiconductor substrate SB in each of the regions 2A and 4A is exposed by selectively and sequentially removing the semiconductor layer SM and the insulating layer BX in each of the regions 2A and 4A so as to leave the semiconductor layer SM and the insulating layer BX in each of the regions 1A and 3A.

Through the above steps, the structure illustrated in FIG. 1 is obtained.

Figure 2:
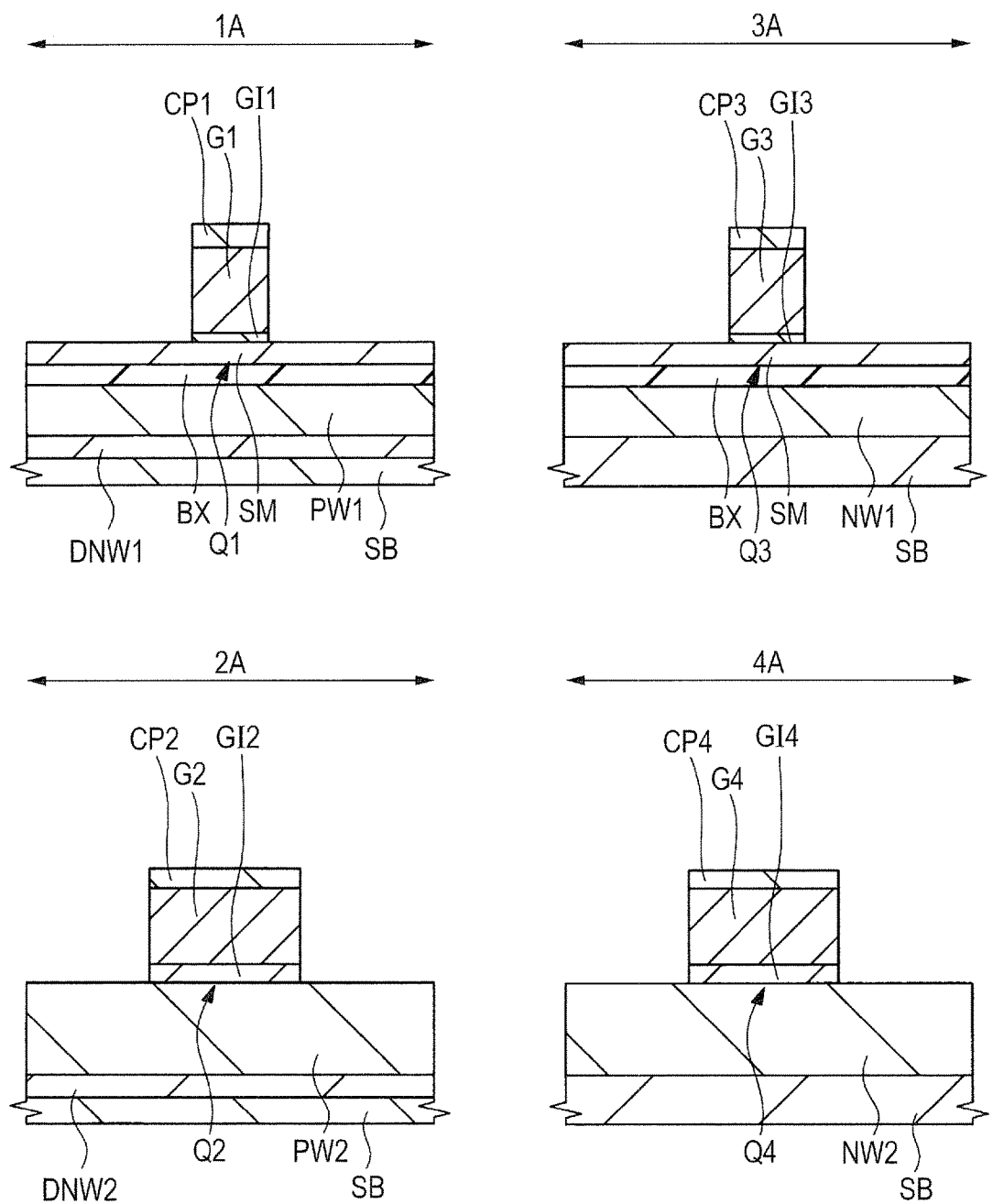
FIG. 2 is a main part sectional view illustrating a manufacturing step of a semiconductor device, following FIG. 1.

Next, by using a thermal oxidation process or the like, a gate insulating film GI1 is formed on the semiconductor layer SM in the region 1A, a gate insulating film GI3 is formed on the semiconductor layer SM in the region 3A, a gate insulating film GI2 is formed on the semiconductor substrate SB in the region 2A, and a gate insulating film GI4 is formed on the semiconductor substrate SB in the region 4A, respectively, as illustrated in FIG. 2. Herein, the thicknesses of each of the gate insulating films GI2 and GI4 is larger than that of each of the gate insulating films GI1 and GI3.

One of the processes for changing the thicknesses of the respective gate insulating films GI1 to GI4 in this manner will be described below. First, a thick silicon oxide film is formed on each of the semiconductor layers SM in the regions 1A and 3A and the semiconductor substrates SB in the regions 2A and 4A by using a thermal oxidation process. Next, the thick silicon oxide film in each of the regions 1A and 3A is selectively removed by using a photolithography process and a dry etching process. Next, a thin silicon oxide film is formed on the semiconductor layer SM in each of the regions 1A and 3A by using a thermal oxidation process again.

In addition, a film, including, for example, hafnium oxide or tantalum oxide and having a higher dielectric constant than silicon oxide, may be formed on each of the gate insulating films GI1 to GI4 by using, for example, a CVD (Chemical Vapor Deposition) process such that the film is used as part of each of the gate insulating films GI1 to GI4.

Subsequently, for example, a polycrystalline silicon film is formed as a conductive film on each of the gate insulating films GI1 to GI4 by using, for example, a CVD process. Next, the polycrystalline silicon film in each of the regions 1A and 2A is allowed to have an n-type and that in each of the regions 3A and 4A is allowed to have a p-type, by selectively introducing impurities into the polycrystalline silicon films with the use of a photolithography process and an ion implantation process. Next, for example, a silicon nitride film is formed as an insulating film on the polycrystalline silicon film by using, for example, a CVD process. Next, a laminated film of the silicon nitride film and the polycrystalline silicon film is patterned. Thereby, the gate electrode G1 and a cap film CP1 are formed on the gate insulating film GI1, a gate electrode G2 and a cap film CP2 are formed on the gate insulating film GI2, the gate electrode G3 and a cap film CP3 are formed on the gate insulating film GI3, and a gate electrode G4 and a cap film CP4 are formed on the gate insulating film GI4. Herein, the gate insulating films GI1 to GI4 other than those under the gate electrodes G1 to G4 may be removed. The thickness of each of the gate electrodes G1 to G4 is approximately 60 nm to 120 nm, and that of each of the cap films CP1 to CP4 is approximately 10 nm to 30 nm.

The conductive film forming each of the gate electrodes G1 to G4 is not limited to a polycrystalline silicon film, but may be a metal film or a laminated film of a polycrystalline silicon film and a metal film. In addition, the material of the insulating film forming each of the cap films CP1 to CP4 is not limited to silicon nitride, but may be another material and it is more preferable that the insulating film is formed of the same material as the material of a sidewall spacer SW1 and a sidewall spacer SW2 that will be described later.

Figure 3:
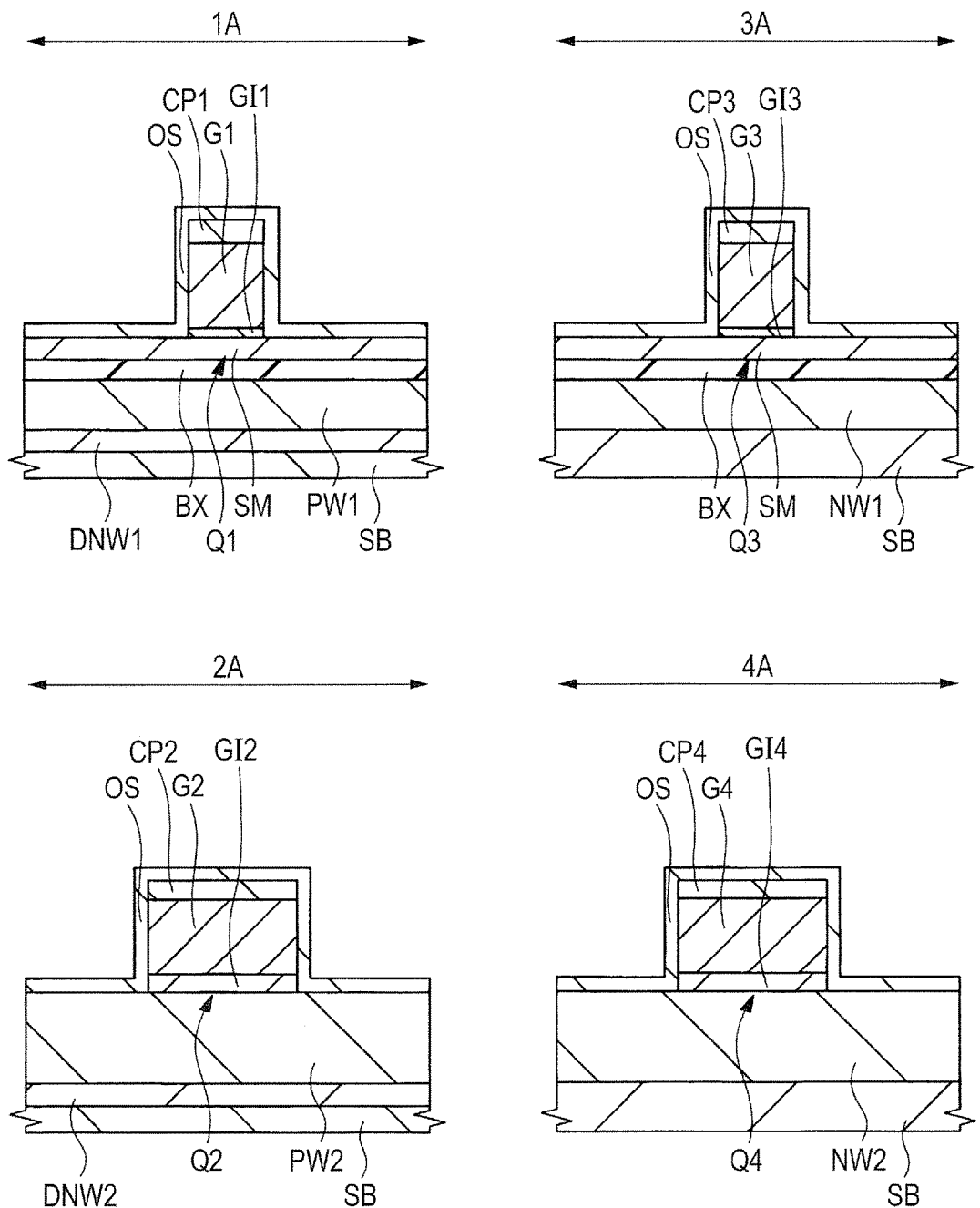
FIG. 3 is a main part sectional view illustrating a manufacturing step of a semiconductor device, following FIG. 2.

Subsequently, an insulating film OS including, for example, silicon oxide is formed, by a CVD process or the like, on the semiconductor layer SM in each of the regions 1A and 3A and on the semiconductor substrate SB in each of the regions 2A and 4A so as to cover the gate electrodes G1 to G4 and the cap films CP1 to CP4, as illustrated in FIG. 3. The thickness of the insulating film OS is approximately 2 nm to 5 nm.

In addition, before the insulating film OS is formed, an insulating film including, for example, silicon nitride may be formed on the upper surface and side surface of each of the gate electrodes G1 to G4 by a CVD process or the like, and thereafter an offset spacer may be formed on the side surface of each of the gate electrodes G1 to G4 by performing anisotropic etching.

Figure 4:
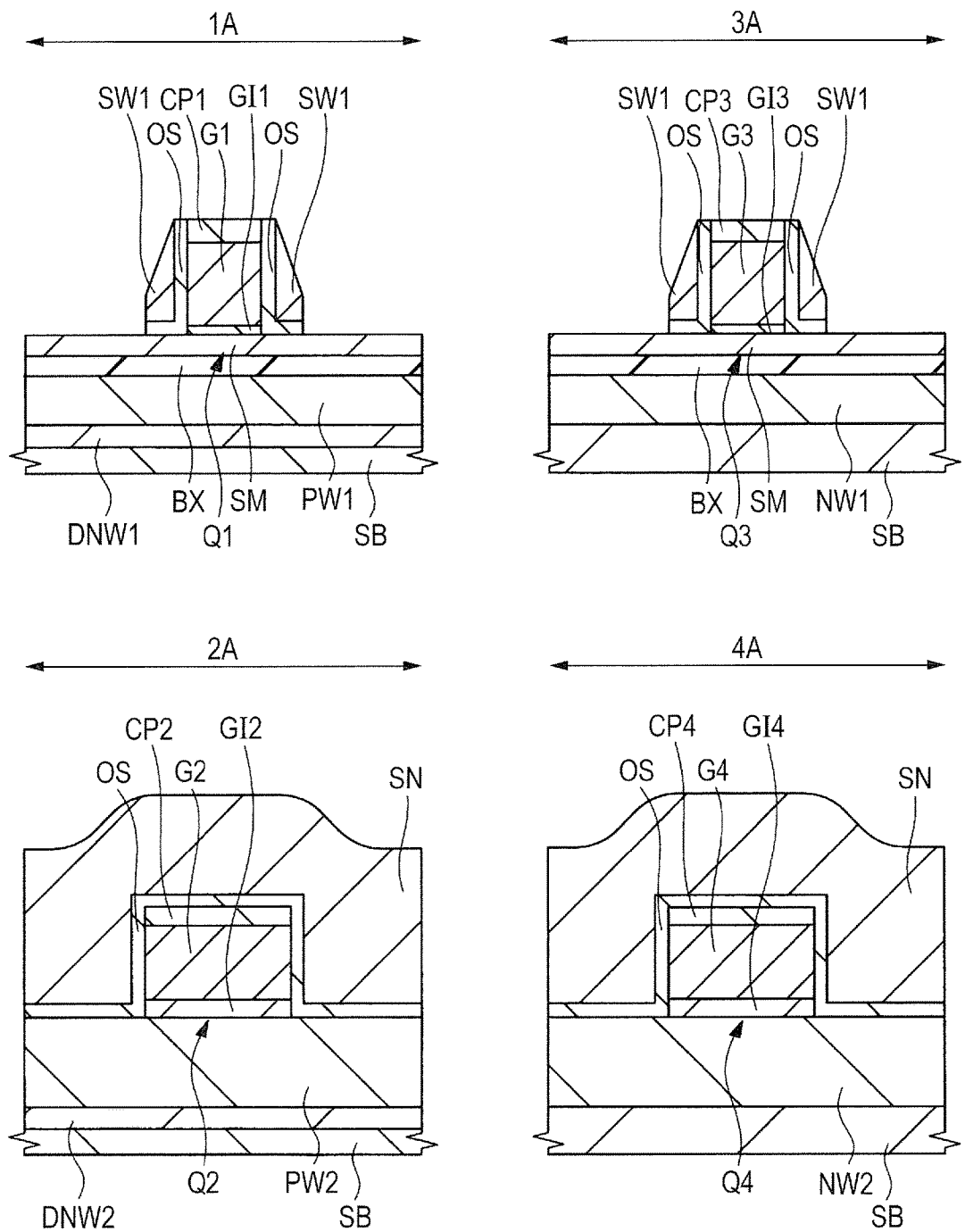
FIG. 4 is a main part sectional view illustrating a manufacturing step of a semiconductor device, following FIG. 3.

Subsequently, an insulating film SN including, for example, silicon nitride is formed on the insulating film OS in each of the regions 1A to 4A by a CVD process or the like, as illustrated in FIG. 4. Next, a resist pattern, covering the insulating film SN in each of the regions 2A and 4A and opening the insulating film SN in each of the regions 1A and 3A, is formed by using a photolithography process. Next, the sidewall spacer SW1 is formed in each of the regions 1A and 3A by performing anisotropic etching on the insulating film SN in each of the regions 1A and 3A with the use of the resist pattern as a mask. Herein, the width of the sidewall spacer SW1, in the gate length direction, of each of the MISFETs Q1 and Q3 is approximately 15 nm to 40 nm. Next, the insulating film OS, formed on each of the semiconductor layer SM, the cap film CP1, and the cap film CP3 that are exposed from the sidewall spacer SW1, is removed by performing dry etching processing or wet etching processing.

Figure 5:
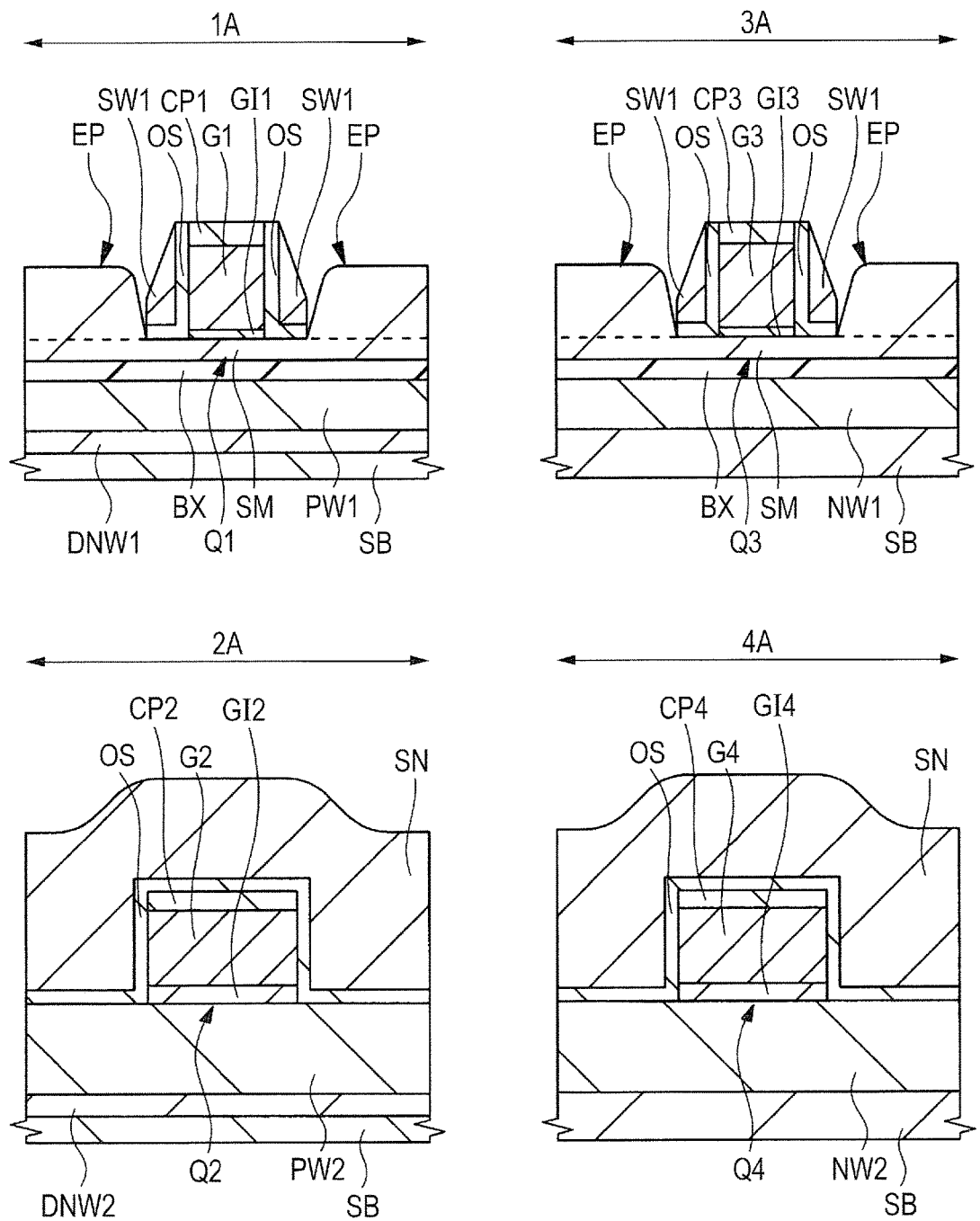
FIG. 5 is a main part sectional view illustrating a manufacturing step of a semiconductor device, following FIG. 4.

Subsequently, an epitaxial layer EP (semiconductor layer EP) including, for example, single crystal silicon is formed on the semiconductor layer SM in each of the regions 1A and 3A by epitaxial growth, as illustrated in FIG. 5. The thickness of the semiconductor layer EP is approximately 20 nm to 40 nm. At the time, the gate electrodes G1 and G3 in the regions 1A and 3A are covered with the cap films CP1 and CP3, respectively, and hence the epitaxial layer EP is not formed on each of the gate electrodes G1 and G3. In addition, the regions 2A and 4A are covered with the insulating film SN, and hence the epitaxial layer EP is not formed thereover.

Herein, it is desirable to perform the epitaxial growth in a state in which impurities are not introduced into the semiconductor layer SM by ion implantation or the like, and for example, it is desirable to perform the epitaxial growth before the later-described extension regions EX1 and EX2 are formed.

The reason is that: when the epitaxial layer EP is formed on the semiconductor layer SM damaged by an ion implantation step, the crystallinity of silicon forming the semiconductor layer SM may vary due to the damage; and hence the epitaxial layer EP may not grow well. As a result, there is the fear that the epitaxial layer EP with desired thickness and shape may not be formed. That is, there are a plurality of the MISFETs Q1 and a plurality of the MISFETs Q3 in the surface of the semiconductor substrate SB, but there is the fear that the thickness and shape of the epitaxial layer EP of each of the MISFETs may vary. Therefore, in the semiconductor device according to the present embodiment, the epitaxial layer EP is formed before the extension regions EX1 and EX2 are formed.

Because the material of the epitaxial layer EP is the same as that of the semiconductor layer SM, they are integrated with each other, but in the present embodiment the boundary between the epitaxial layer EP and the semiconductor layer SM is indicated by a dashed line in order to make it easier to understand the invention. In addition, when diffusion layers SD1 and SD2 are formed in the epitaxial layer EP and the semiconductor layer SM by the later-described steps, it becomes very difficult to illustrate the epitaxial layer EP, and hence the epitaxial Layer EP is indicated by an arrow in the views.

Figure 6:
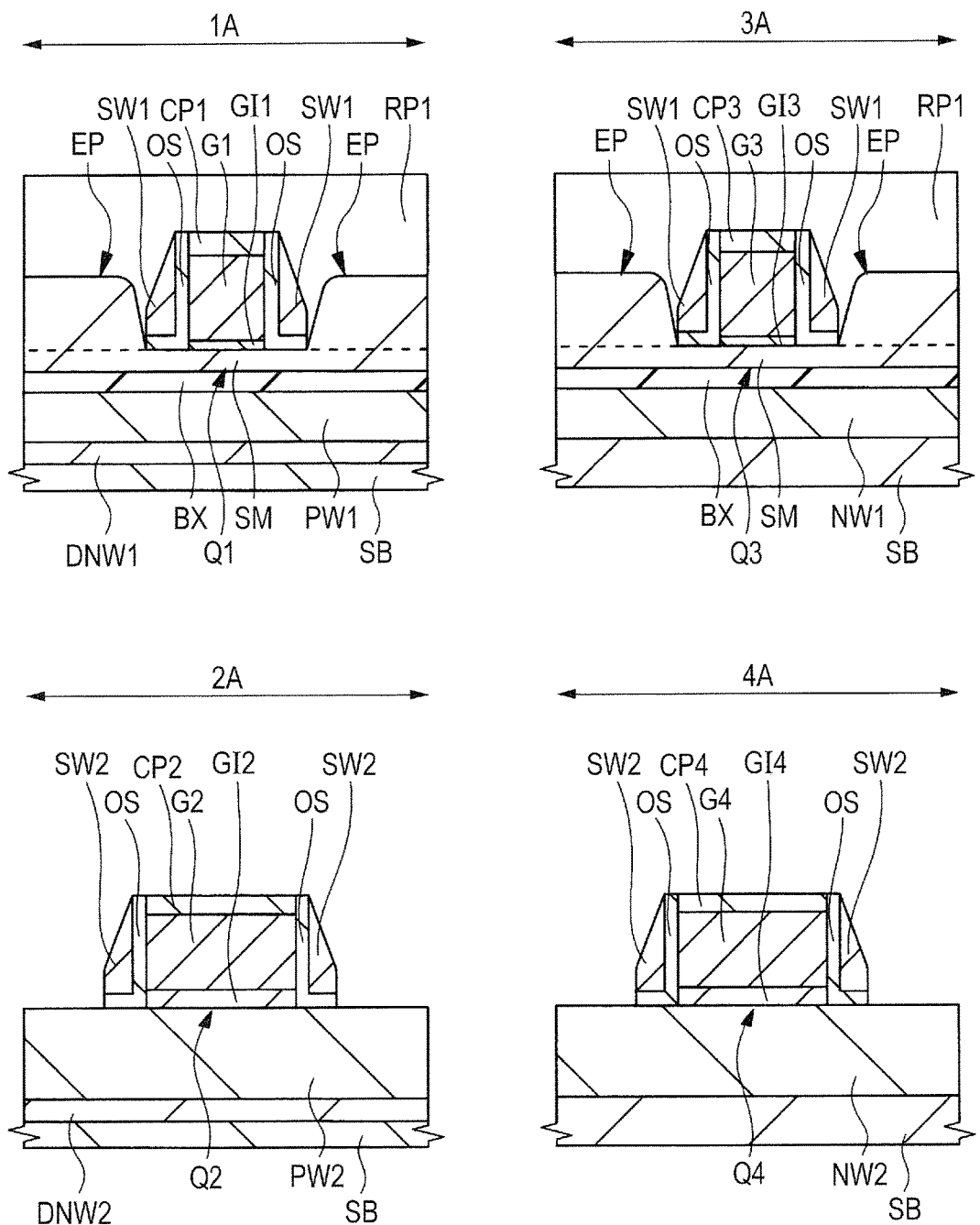
FIG. 6 is a main part sectional view illustrating a manufacturing step of a semiconductor device, following FIG. 5.

Subsequently, a resist pattern RP1, covering the regions 1A and 3A and opening the regions 2A and 4A, is formed as illustrated in FIG. 6. Next, the insulating film SN in each of the regions 2A and 4A is processed by performing anisotropic etching with the use of the resist pattern RP1 as a mask, so that the sidewall spacer SW2 is formed via the insulating film OS on the side surface of each of the gate electrodes G2 and G4. Next, the insulating film OS, formed on each of the semiconductor substrate SB, the cap film CP2, and the cap film CP4 that are exposed from the sidewall spacer SW2, is removed by performing dry etching processing or wet etching processing. Thereafter, the resist pattern RP1 is removed by ashing processing.

Figure 7:
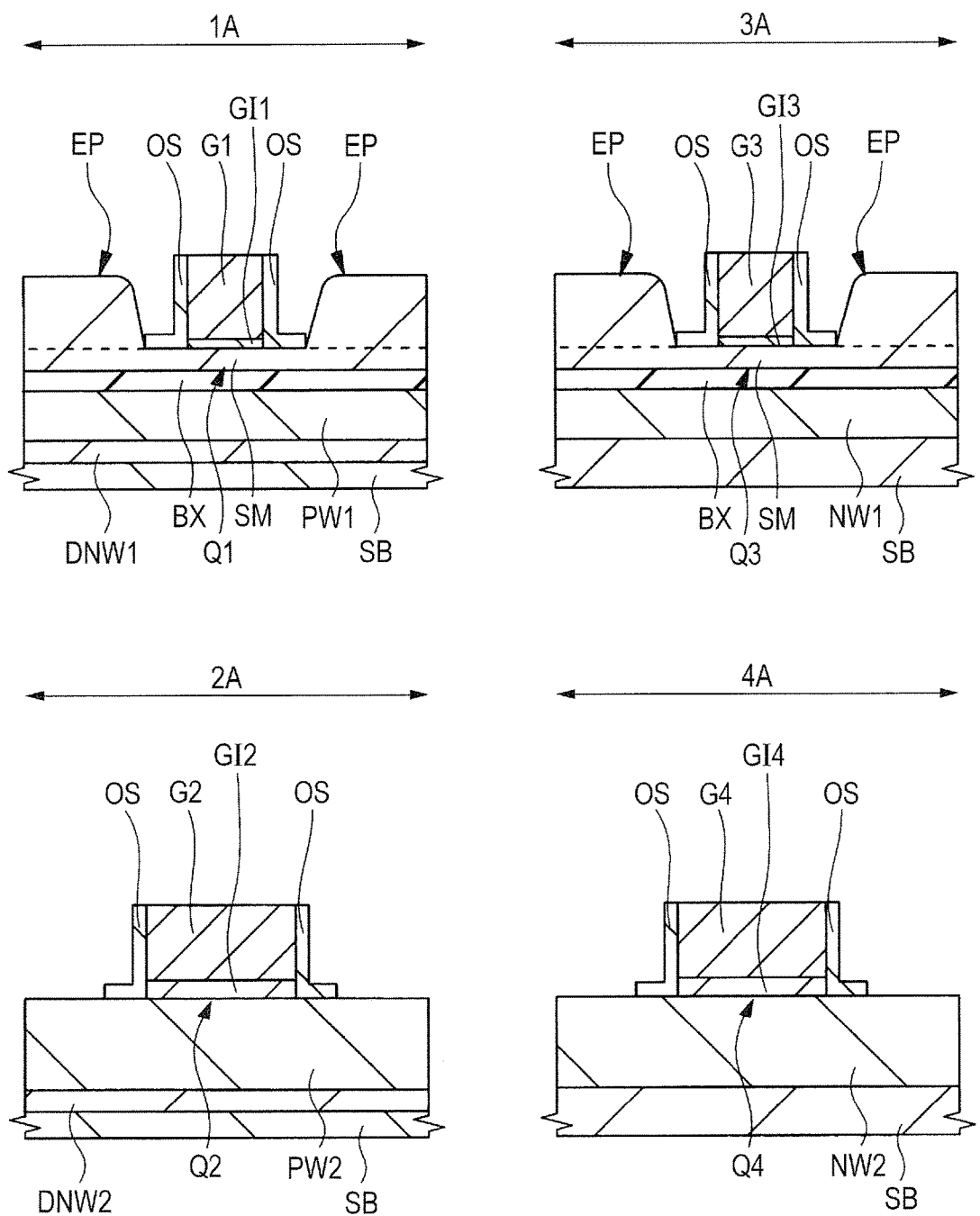
FIG. 7 is a main part sectional view illustrating a manufacturing step of a semiconductor device, following FIG. 6.

Subsequently, by performing etching having a high selectivity to the insulating film OS, the sidewall spacer SW1, the cap film CP1, and the cap film CP3 are removed in the regions 1A and 3A, and the sidewall spacer SW2, the cap film CP2, and the cap film CP4 are removed in the regions 2A and 4A, as illustrated in FIG. 7. Therefore, the insulating film OS formed on the side surface of each of the gate electrodes G1 to G4 is hardly etched and remains. In addition, the sidewall spacers SW1 and SW2 are formed of the same material as that of the cap insulating films CP1 to CP4, and hence they can be removed at the same time. Therefore, it is unnecessary to add a mask, whereby manufacturing steps can be simplified.

Figure 8:
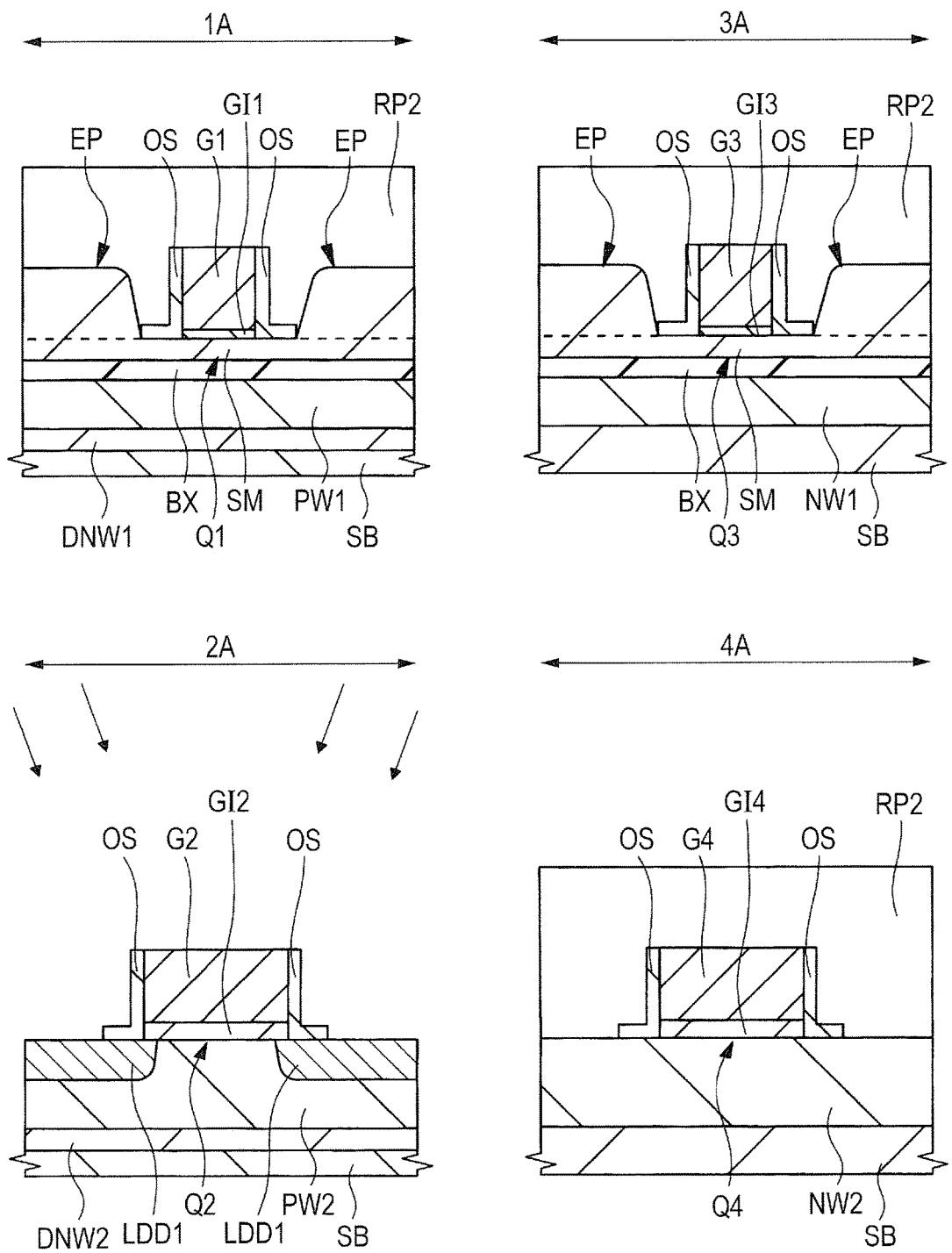
FIG. 8 is a main part sectional view illustrating a manufacturing step of a semiconductor device, following FIG. 7.

Subsequently, a resist pattern RP2, covering the regions 1A, 3A, and 4A and opening the region 2A, is formed as illustrated in FIG. 8. Next, impurities are introduced into the semiconductor substrate SB in the region 2A by an ion implantation process with the use of the resist pattern RP2 as a mask, whereby a semiconductor region LDD1 having an n-type conductivity is formed. The semiconductor region LDD1 becomes part of the source region or the drain region of the MISFET Q2. The impurity for forming the semiconductor region LDD1 is, for example, phosphorus (P) or arsenic (As), and the ion implantation is performed under conditions in which energy is set to 20 to 40 keV and a dose amount is set to approximately $1\times10^{13}$ to $2\times10^{14}/cm^2$. The ion implantation for forming the semiconductor region LDD1 is performed by using oblique ion implantation such that the semiconductor region LDD1 reaches just under the gate electrode G2, and for example, the ion implantation is performed at an angle inclined by 15° or more and 45° or less with respect to the perpendicular to the semiconductor substrate SB. In this oblique ion implantation, the angle inclined with respect to the perpendicular to the semiconductor substrate SB is larger than that in the later-described vertical ion implantation. Thereafter, the resist pattern RP2 is removed by ashing processing.

Figure 9:
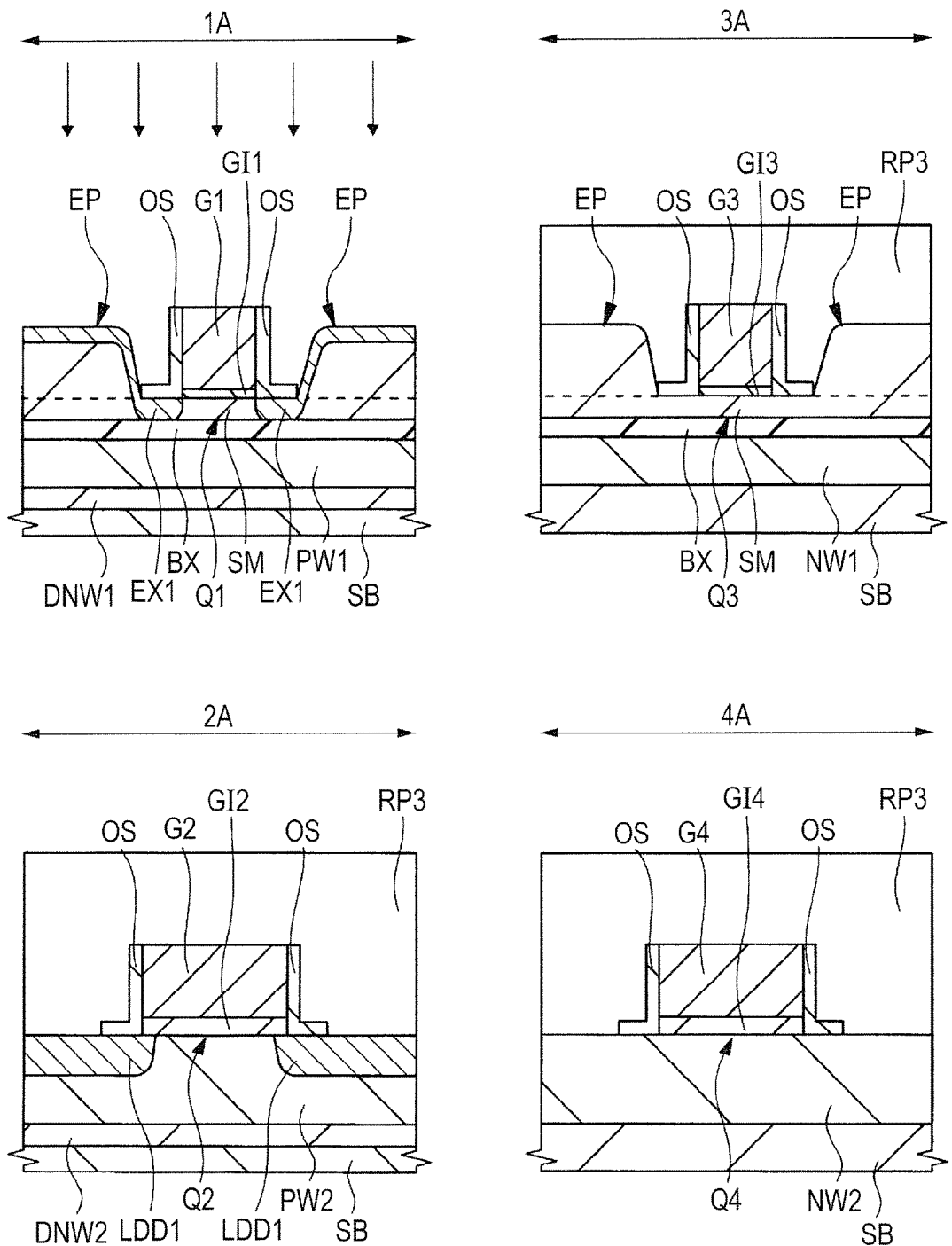
FIG. 9 is a main part sectional view illustrating a manufacturing step of a semiconductor device, following FIG. 8.

Subsequently, a resist pattern RP3, covering the regions 2A, 3A, and 4A and opening the region 1A, is formed as illustrated in FIG. 9. Next, impurities are introduced into the semiconductor layer SM and the epitaxial layer EP in the region 1A by an ion implantation process with the use of the resist pattern RP3 as a mask, whereby the extension region EX1 (semiconductor region EX1) having an n-type conductivity is formed. The extension region EX1 becomes part of the source region or the drain region of the MISFET Q1. The impurity for forming the extension region EX1 is, for example, arsenic (As), and the ion implantation is performed under conditions in which energy is set to 2 to 5 keV and a dose amount is set to approximately $1\times10^{14}$ to $6\times10^{14}/cm^2$.

The ion implantation for forming the extension region EX1 is performed by vertical ion implantation, and for example, the ion implantation is performed at an angle substantially perpendicular to the semiconductor substrate SB. The substantially perpendicular angle described herein means an angle at which ions can reach the semiconductor layer SM under the insulating film OS without being blocked by the epitaxial layer EP, and for example, means an angle perpendicular to the semiconductor substrate SB or an angle inclined by 10° or less with respect to the perpendicular to the semiconductor substrate SB. The angle of the vertical ion implantation is smaller than that in the above oblique ion implantation.

The reason why such vertical ion implantation is used is that because the height of the upper surface of the epitaxial layer EP is larger than the upper surface of the semiconductor layer SM, ion implantation at an angle larger than the above-mentioned substantially vertical angle is blocked by the epitaxial layer EP. Therefore, in order to form the extension region EX1 in the semiconductor layer SM on both sides of the gate electrode G1 (the semiconductor layer SM under the insulating film OS) by ion implantation, it is necessary to perform the ion implantation at the above-mentioned substantially vertical angle.

However, when vertical ion implantation is performed, part of the ions may be blocked by the thickness of the insulating film OS formed on the side surface of the gate electrode G1, and hence the extension region EX1 is likely to be formed at a position not reaching just under the gate electrode G1 or at a position slightly reaching just thereunder. That is, the end of the extension region EX1 is formed at a position not overlapping the gate electrode G1 or at a position slightly overlapping it. Therefore, the effective channel length of the MISFET Q1 is increased to a higher level than in the case where it is assumed that the epitaxial layer EP is not present and oblique ion implantation can be used, and hence there is the problem that the on-current of the MISFET Q1 is lowered.

Therefore, the present inventors have considered to form the extension region EX1 to sufficiently reach just under the gate electrode G1 by devising a heat treatment step and as a result to achieve both the reliability and performance of a semiconductor device. Details of this consideration will be described later in detail.

In addition, the ion implantation for forming the extension region EX1 is performed in a state in which the insulating film OS is left on the semiconductor layer SM, and hence it can be alleviated that the semiconductor layer SM may be damaged due to ion implantation. Alleviation of such damage contributes to an increase in the on-current of the MISFET Q1.

After the extension region EX1 is formed, the resist pattern RP3 illustrated in FIG. 9 is removed by ashing processing. Thereafter, the impurities contained in the semiconductor region LDD1 and the extension region EX1 are activated by performing a first heat treatment on the semiconductor substrate SB, for example, at 950° C. for 120 seconds as the conditions in which the temperature is 900° C. or higher and the time is 100 seconds or more. Thereby, the extension region EX1 is diffused to just under the gate electrode G1. Specifically, arsenic (As), the impurity forming the extension region EX1, is diffused in a range ranging from 2 nm or more to 10 nm or less. Herein, the time for which the first heat treatment is performed is set to be longer than the time for which the later-described second heat treatment is performed.

Further, manufacturing steps can be simplified by simultaneously performing the first heat treatment on the n-type semiconductor region LDD1 formed in the region 2A and the n-type extension region EX1 formed in the region 1A.

Figure 10:
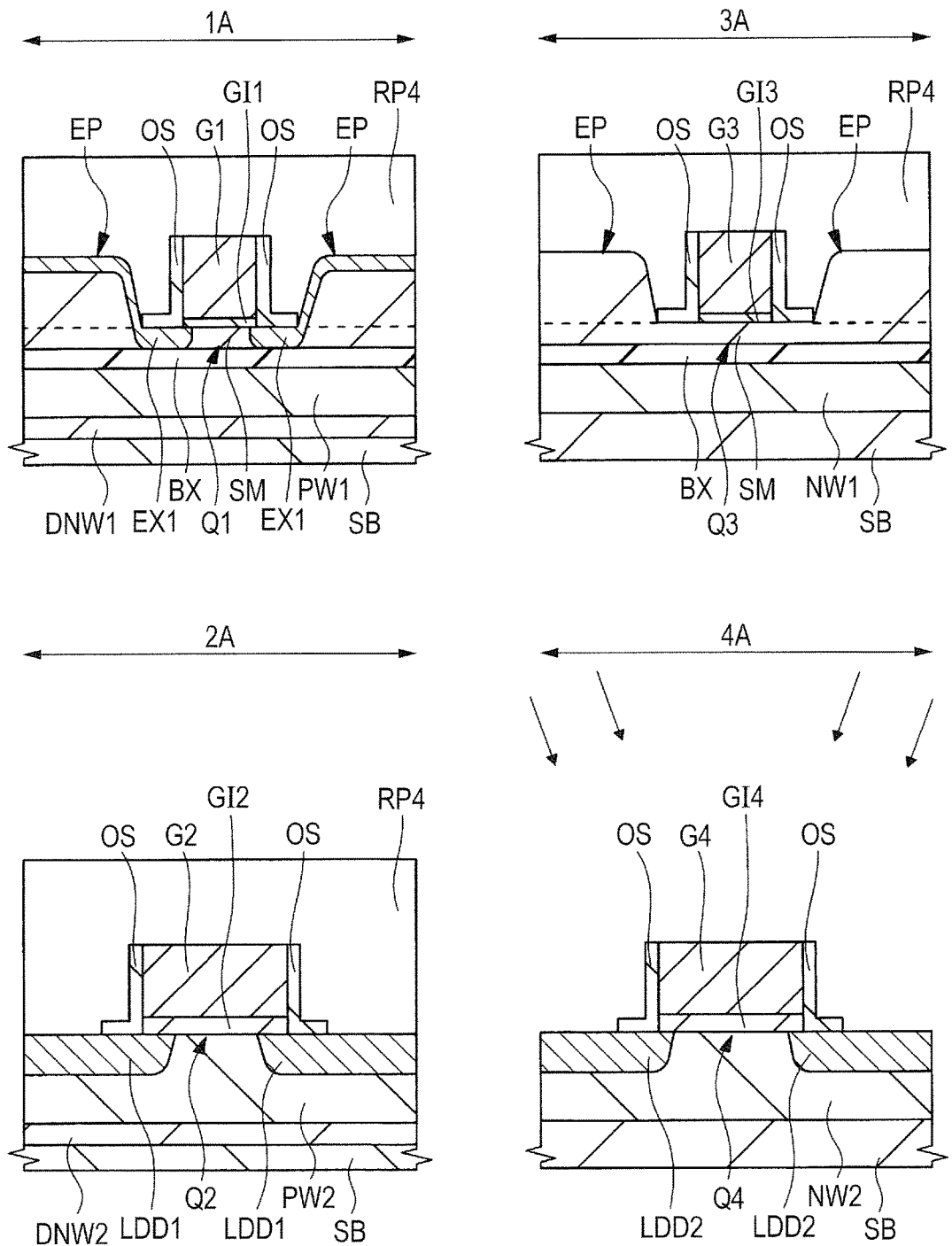
FIG. 10 is a main part sectional view illustrating a manufacturing step of a semiconductor device, following FIG. 9.

Subsequently, a resist pattern RP4, covering the regions 1A, 2A, and 3A and opening the region 4A, is formed as illustrated in FIG. 10. Next, impurities are introduced into the semiconductor substrate SB in the region 4A by an ion implantation process with the use of the resist pattern RP4 as a mask, whereby a semiconductor region LDD2 having a p-type conductivity is formed. The semiconductor region LDD2 becomes part of the source region or the drain region of the MISFET Q4. The impurity for forming the semiconductor region LDD2 is, for example, boron difluoride ($BF_2$), and the ion implantation is performed under conditions in which energy is set to 20 to 40 keV and a dose amount is set to approximately $1 \times 10^{13}$ to $2 \times 10^{14}/cm^2$. The ion implantation for forming the semiconductor region LDD2 is performed by oblique ion implantation similar to the step of forming the semiconductor region LDD1. Thereafter, the resist pattern RP4 is removed by ashing processing.

Figure 11:
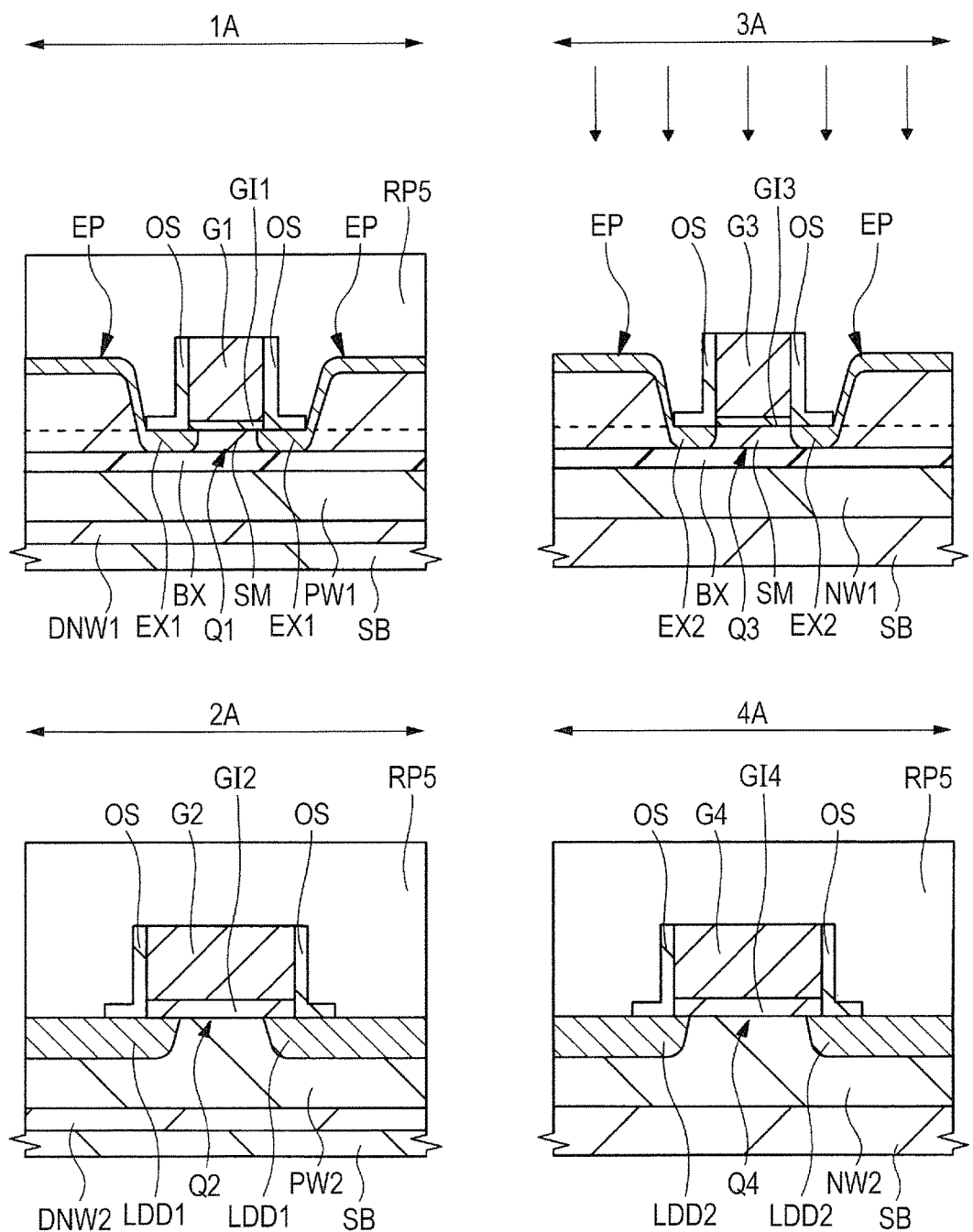
FIG. 11 is a main part sectional view illustrating a manufacturing step of a semiconductor device, following FIG. 10.

Subsequently, a resist pattern RP5, covering the regions 1A, 2A, and 4A and opening the region 3A, is formed as illustrated in FIG. 11. Next, impurities are introduced into the semiconductor layer SM and the epitaxial layer EP in the region 3A by an ion implantation process with the use of the resist pattern RP5 as a mask, whereby the extension region EX2 (semiconductor region EX2) having a p-type conductivity is formed. The extension region EX2 becomes part of the source region or the drain region of the MISFET Q3. The impurity for forming the extension region EX2 is, for example, boron difluoride ($BF_2$), and the ion implantation is performed under conditions in which energy is set to 2 to 5 keV and a dose amount is set to approximately $1 \times 10^{14}$ to $6 \times 10^{14}/cm^2$. The ion implantation for forming the extension region EX2 is performed by vertical ion implantation similar to the step of forming the extension region EX1. Thereafter, the resist pattern RP5 is removed by ashing processing.

Figure 12:
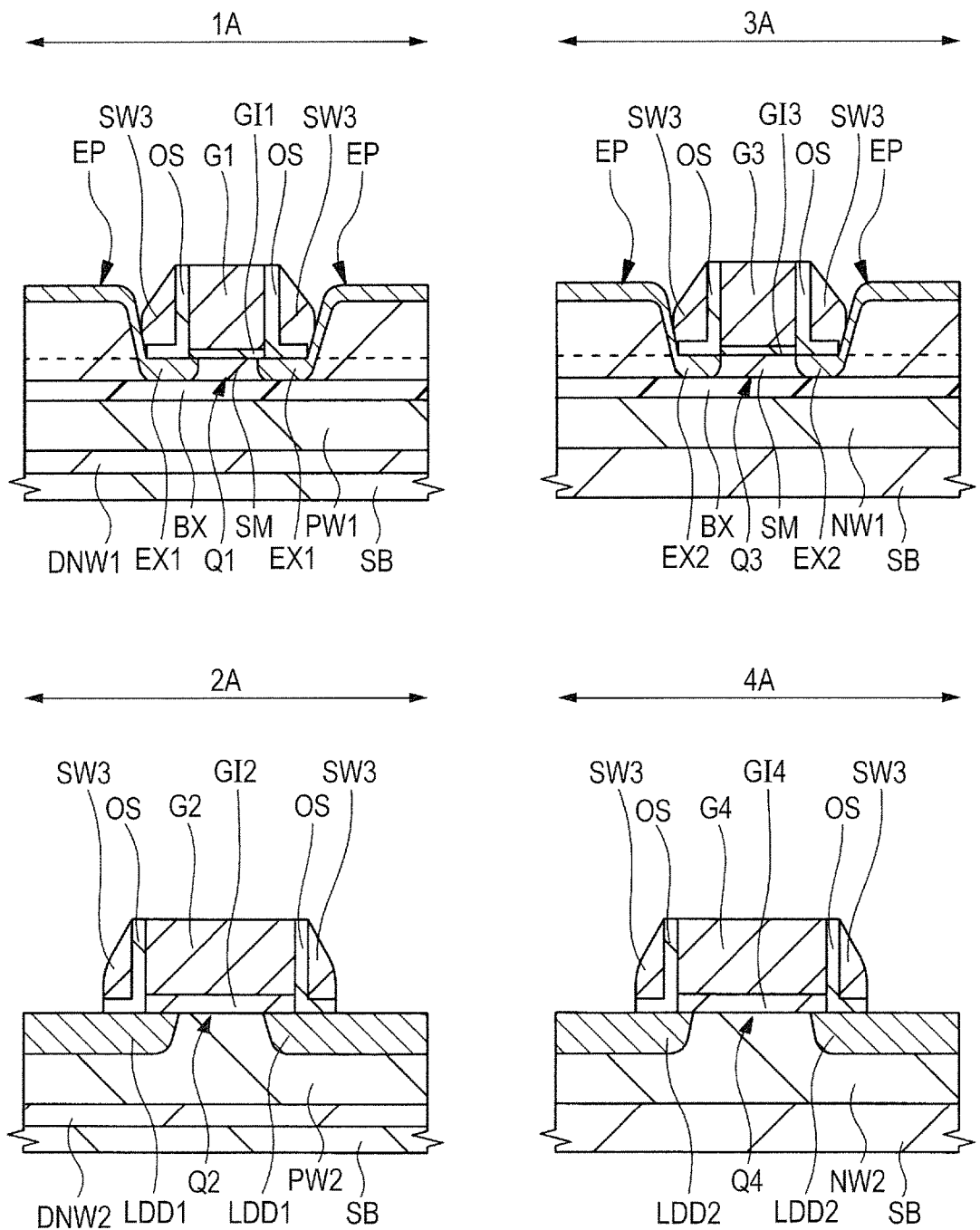
FIG. 12 is a main part sectional view illustrating a manufacturing step of a semiconductor device, following FIG. 11.

Subsequently, a sidewall spacer SW3 is formed on the side surface of each of the gate electrodes G1 to G4, as illustrated in FIG. 12. The step of forming the sidewall spacer SW3 can be performed as follows. First, an insulating film including, for example, a silicon nitride film is formed in each of the regions 1A to 4A so as to cover the gate electrodes G1 to G4 and the insulating film OS. Next, anisotropic etching is performed on the insulating film, whereby the sidewall spacer SW3 is formed, via the insulating film OS, on the side surface of each of the gate electrodes G1 to G4.

In the regions 1A and 3A, the end of the sidewall spacer SW3 is located on the upper surface of the epitaxial layer EP. This is to prevent the later-described silicide film SL from reaching the semiconductor layer SM under the insulating film OS with a metal, serving as the origin of the silicide film SL, excessively reacting with the epitaxial layer EP in the step of forming the silicide film SL.

Figure 13:
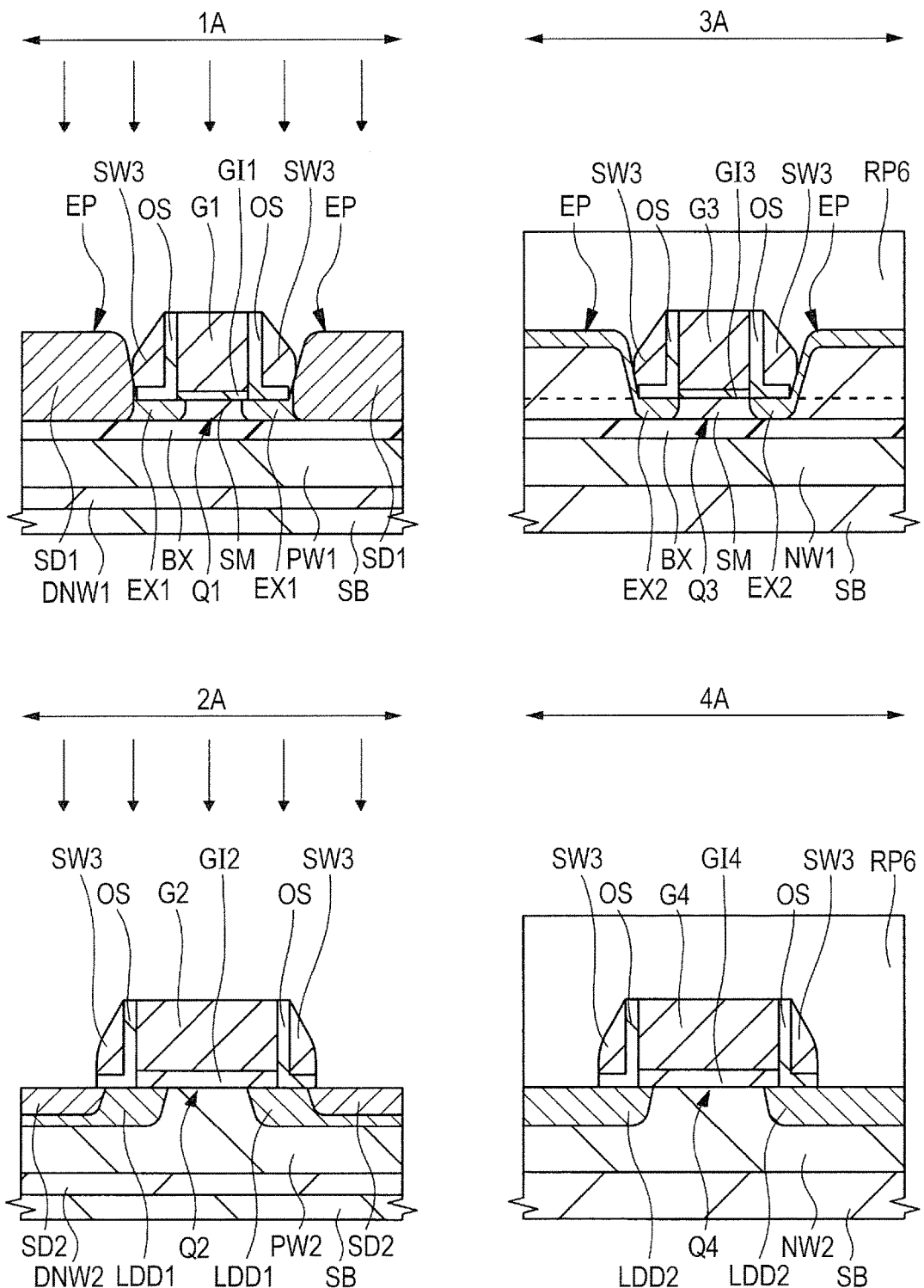
FIG. 13 is a main part sectional view illustrating a manufacturing step of a semiconductor device, following FIG. 12.

Subsequently, a resist pattern RP6, covering the regions 3A and 4A and opening the regions 1A and 2A, is formed as illustrated in FIG. 13. Next, impurities are introduced into the epitaxial layer EP and the semiconductor layer SM in the region 1A and into the semiconductor substrate SB in the region 2A by an ion implantation process with the use of the resist pattern RP6 as a mask, whereby the diffusion layer SD1 (semiconductor region SD1) having an n-type conductivity is formed in the region 1A and the diffusion layer SD2 (semiconductor region SD2) having an n-type conductivity is formed in the region 2A. The diffusion layer SD1 becomes part of the source region or the drain region of the MISFET Q1. The diffusion layer SD2 becomes part of the source region or the drain region of the MISFET Q2. Herein, the impurity concentration of the diffusion layer SD1 is higher than that of the extension EX1, and the impurity concentration of the diffusion layer SD2 is higher than that of the semiconductor region LDD1. The impurity for forming the diffusion layers SD1 and SD2 is, for example, phosphorus (P) or arsenic (As), and the ion implantation is performed under conditions in which energy is set to 5 to 30 keV and a dose amount is set to approximately $1\times10^{15}$ to $1\times10^{16}/cm^2$. Thereafter, the resist pattern RP6 is removed by ashing processing.

In the present embodiment, the ion implantation processes for forming the diffusion layers SD1 and SD2 are performed at the same time, but they may be individually performed by using individual resist patterns.

Figure 14:
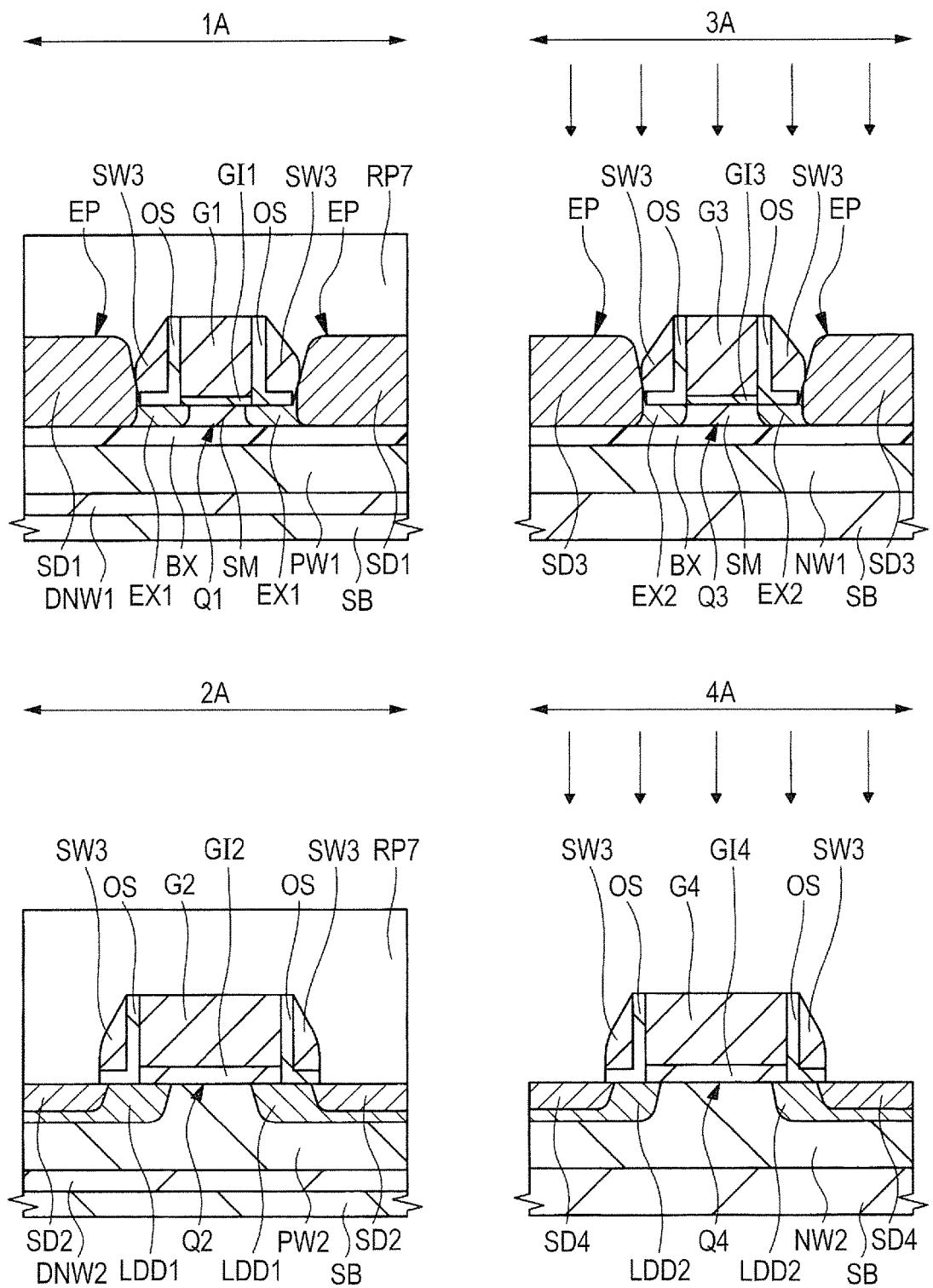
FIG. 14 is a main part sectional view illustrating a manufacturing step of a semiconductor device, following FIG. 13.

Subsequently, a resist pattern RP7, covering the regions 1A and 2A and opening the regions 3A and 4A, is formed as illustrated in FIG. 14. Next, impurities are introduced into the epitaxial layer EP and the semiconductor layer SM in the region 3A and into the semiconductor substrate SB in the region 4A by an ion implantation process with the use of the resist pattern RP7 as a mask, whereby a diffusion layer SD3 (semiconductor region SD3) having a p-type conductivity is formed in the region 3A and a diffusion layer SD4 (semiconductor region SD4) having a p-type conductivity is formed in the region 4A. The diffusion layer SD3 becomes part of the source region or the drain region of the MISFET Q3. The diffusion layer SD4 becomes part of the source region or the drain region of the MISFET Q4. Herein, the impurity concentration of the diffusion layer SD3 is higher than that of the extension EX2, and the impurity concentration of the diffusion layer SD4 is higher than that of the semiconductor region LDD2. The impurity for forming the diffusion layers SD3 and SD4 is, for example, boron (B), and the ion implantation is performed under conditions in which energy is set to 1 to 5 keV and a dose amount is set to approximately $1\times10^{15}$ to $1\times10^{16}/cm^2$. Thereafter, the resist pattern RP7 is removed by ashing processing.

In the present embodiment, the ion implantation processes for forming the diffusion layers SD3 and SD4 are performed at the same time, but they may be individually performed by using individual resist patterns.

Thereafter, the impurities contained in the semiconductor region LDD2, the extension region EX2, and the diffusion layers SD1 to SD4 are activated by performing the second heat treatment on the semiconductor substrate SB, for example, at 1050° C. for 0.1 seconds as the conditions in which the temperature is 900° C. or higher and the time is 1 second or less. Herein, the second heat treatment is also performed on the n-type semiconductor region LDD1 and the n-type extension region EX1 that have previously been subjected to the first heat treatment, but the time of the second heat treatment is much less than that of the first heat treatment, and hence the diffusion lengths of the semiconductor region LDD1 and the n-type extension region EX1 are hardly changed. Herein, a short-time heat treatment, like the second heat treatment, is generally referred to as TED (Transient Enhanced Diffusion) suppressing annealing or spike annealing.

Figure 15:
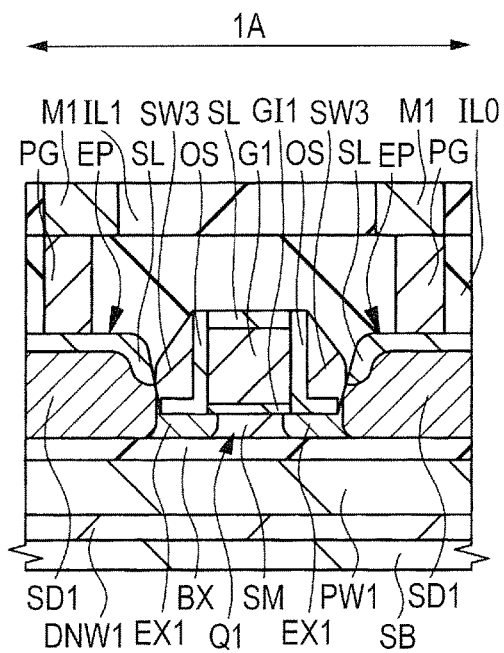
FIG. 15 is a main part sectional view illustrating a manufacturing step of a semiconductor device, following FIG. 14.
Figure 15:
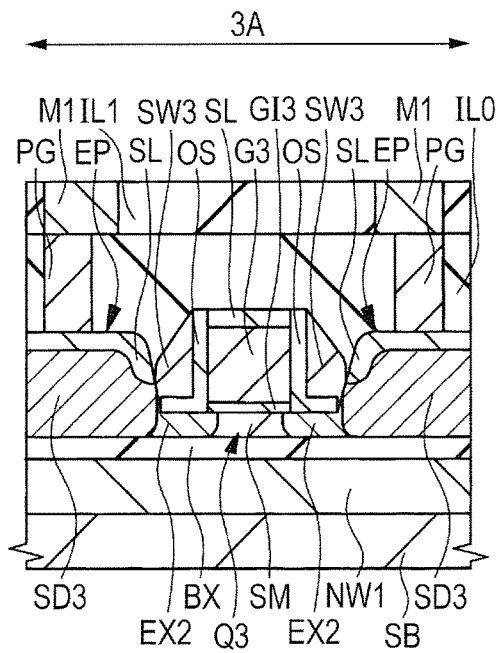
Figure 15:
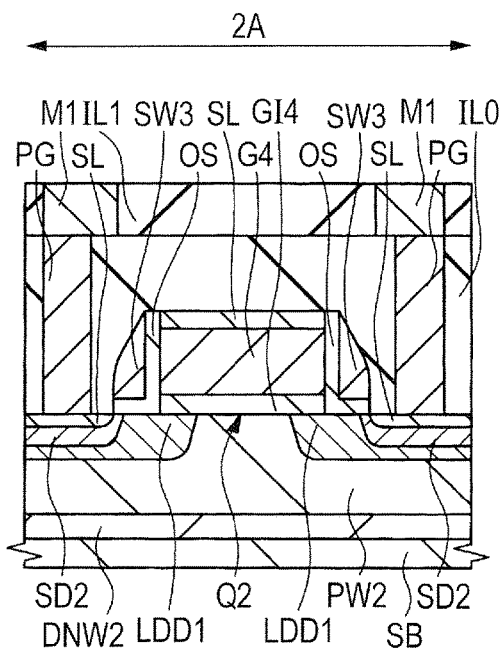
Figure 15:
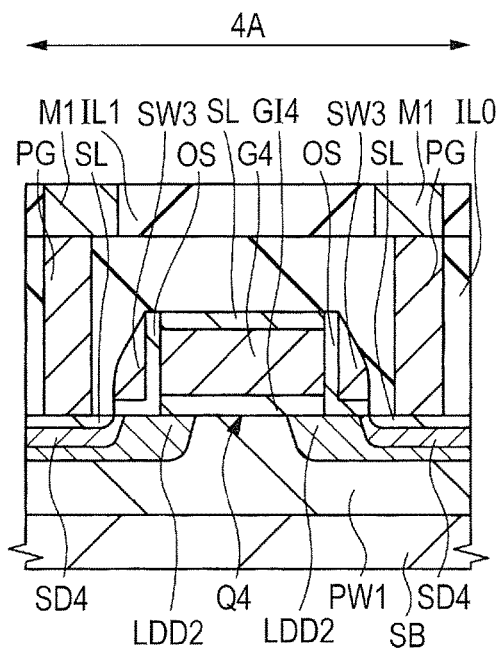

Subsequently, the low-resistance silicide films SL are formed on each of the diffusion layers SD1 to SD4 and each of the gate electrodes G1 to G4 by a Salicide (Self Aligned Silicide) technique, as illustrated in FIG. 15.

Specifically, the silicide film SL can be formed as follows. In each of the regions 1A to 4A, a metal film for forming the silicide film SL is formed to cover each of the gate electrodes G1 to G4. This metal film includes, for example, cobalt, nickel, or a nickel platinum alloy. Next, each of the diffusion layers SD1 to SD4 and each of the gate electrodes G1 to G4 are allowed to react with the metal film by performing a heat treatment on the semiconductor substrate SB. Thereby, the silicide films SL are formed on each of the diffusion layers SD1 to SD4 and each of the gate electrodes G1 to G4. Thereafter, the unreacted metal film is removed. By forming the silicide film SL, the diffusion resistance and the contact resistance in each of the diffusion layers SD1 to SD4 and the gate electrodes G1 to G4 can be lowered.

Each of the MISFETs Q1 to Q4 is formed by the above steps.

Subsequently, an interlayer insulating film IL0 is formed in each of the regions 1A to 4A so as to cover each of the MISFETs Q1 to Q4. As the interlayer insulating film IL0, a single film of a silicon oxide film, a laminated film in which a silicon nitride film and a thick silicon oxide film thereover are formed, or the like can be used. After the interlayer insulating film IL0 is formed, the upper surface of the interlayer insulating film IL0 may be polished by a CMP (Chemical Mechanical Polishing) process, if necessary.

Next, a plug PG is formed in the interlayer insulating film IL0 by forming a contact hole in the interlayer insulating film IL0 by a photolithography process, a dry etching process, and the like and then by burying a conductive film including tungsten (W) or the like in the contact hole.

Next, an interlayer insulating film IL1 is formed on the interlayer insulating film IL0 in which the plug PG is buried. Thereafter, a trench for wiring is formed in the interlayer insulating film IL1 and then a conductive film containing, for example, copper as a main component is buried in the trench for wiring, whereby a first wiring M1 to be connected with the plug PG is formed in the interlayer insulating film IL1. The structure of the first wiring Ml is referred to as the so-called damascene wiring structure.

Thereafter, the second and subsequent wirings are formed by a dual damascene process or the like, but illustration and description thereof are omitted herein. In addition, the first wiring M1 and the wirings above the first wiring M1 are not limited to the damascene wiring structure, but they may be formed by patterning a conductive film, and for example, they may be tungsten wirings or aluminum wirings.

The semiconductor device according to the present embodiment can be manufactured in this way.

<Main Characteristics of Method of Manufacturing Semiconductor Device>

A main characteristic of the method of manufacturing a semiconductor device in the present embodiment is the first heat treatment described with reference to FIG. 9, in which a long-time heat treatment is performed on the n-type extension region EX1 formed in the region 1A.

This point will be described below, in which the relationship between the first heat treatment and the second heat treatment described with reference to FIG. 14 and the like is included.

Figure 16:
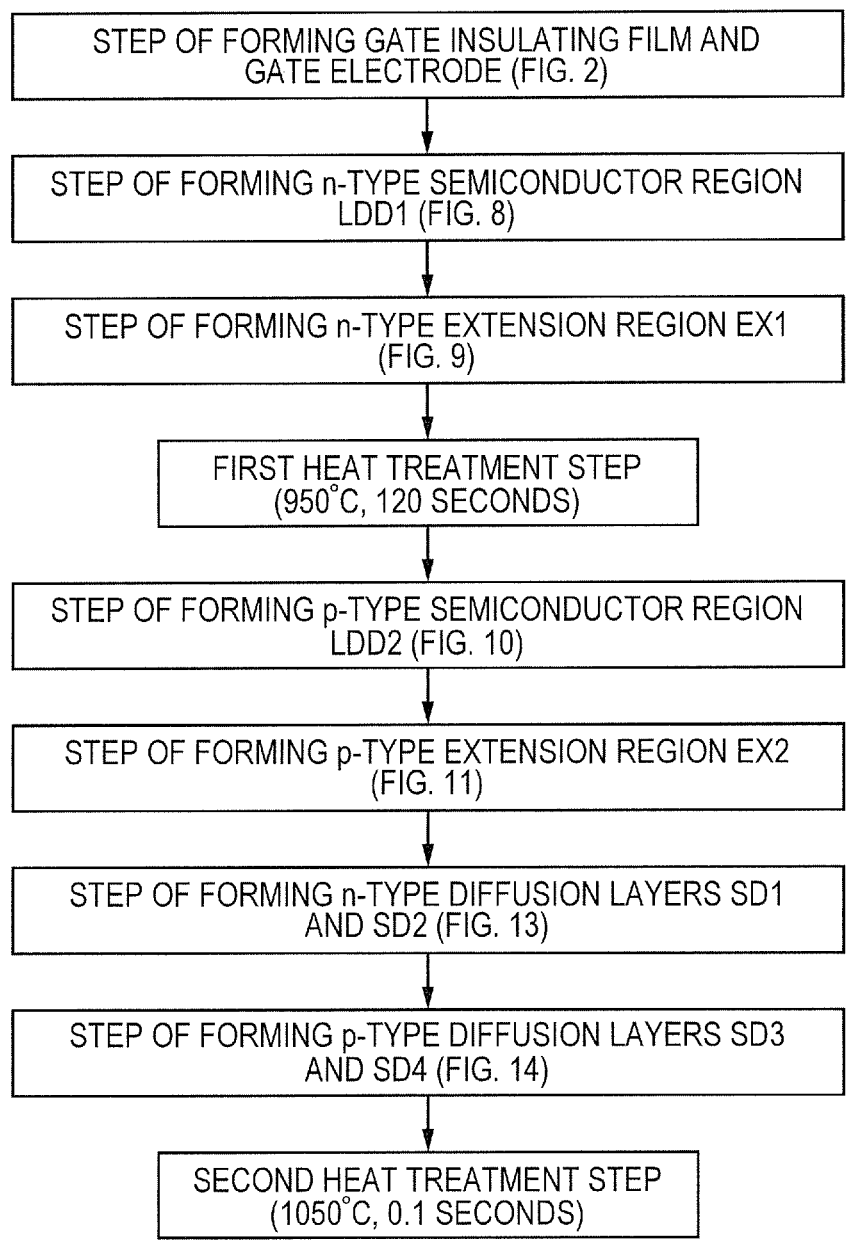
FIG. 16 is a process flow simply showing main steps of the manufacturing steps of a semiconductor device according to one embodiment.

FIG. 16 briefly summarizes, of the manufacturing steps described in the present embodiment, the ion implantation step and the heat treatment step related to the main characteristic of the embodiment.

After each of the gate electrodes G1 to G4 is formed, the n-type semiconductor region LDD1 and the n-type extension region EX1 are formed.

Thereafter, the first heat treatment is performed on the semiconductor substrate SB, for example, at 950° C. for 120 seconds as the conditions in which the temperature is 900° C. or higher and the time is 100 seconds or more. The first heat treatment is one in which the extension region EX1 is surely diffused to just under the gate electrode G1. Specifically, arsenic (As), the impurity forming the extension region EX1, is diffused in a range ranging from 2 nm or more to 10 nm or less.

Subsequently, the p-type semiconductor region LDD2, the p-type extension region EX2, the n-type diffusion layer SD1, the n-type diffusion layer SD3, the p-type diffusion layer SD2, and the p-type diffusion layer SD4 are sequentially formed by an ion implantation process.

Thereafter, the impurities contained in each of them are activated by performing the second heat treatment on the semiconductor substrate SB, for example, at 1050° C. for 0.1 seconds as the conditions in which the temperature is 900° C. or higher and the time is 1 second or less. That is, the second heat treatment is performed for a less time than the first heat treatment.

Phosphorus (P) or arsenic (As) forming an n-type impurity originally has a diffusion coefficient lower than that of boron (B) or boron difluoride ($BF_2$) forming a p-type impurity, and hence phosphorus (P) or arsenic (As) is less likely to be diffused. Further, when the extension region EX1 is formed by oblique ion implantation like the semiconductor region LDD1, it maybe be blocked by the epitaxial layer EP, and hence the extension region EX1 is formed by vertical ion implantation, as described with reference to FIG. 9. Therefore, the end of the extension region EX1 is formed at a position not overlapping the gate electrode G1 or a position slightly overlapping the gate electrode G1, at the end of the vertical ion implantation. Therefore, in order to surely diffuse the extension region EX1 including n-type impurities to just under the gate electrode G1, it is necessary to extend the time of the first heat treatment performed after the semiconductor region LDD1 and the extension region EX1 are formed.

For example, if it is attempted to diffuse the extension region EX1 by the second heat treatment performed for a short time, it is difficult to surely diffuse the extension region EX1 including n-type impurities to just under the gate electrode G1. Therefore, if the time of the second heat treatment is extended to the same extent as the first heat treatment, the extension region EX2 including p-type impurities is diffused too much because the p-type impurity has a high diffusion coefficient, and hence the short-channel characteristics of the MISFET Q3 are deteriorated. In addition, if the time of a heat treatment is too long, p-type impurities such as boron are attracted to the gate insulating film GI3. Therefore, a high concentration region is locally formed in the interface between the gate insulating film GI3 and the semiconductor layer SM, whereby a problem referred to as so-called pile-up may be caused in which an electric field concentrates on part of the gate insulating film GI3. The problem of pile-up is similarly caused also in the semiconductor region LDD2 of the MISFET Q4. Therefore, it is desirable to perform the second heat treatment for a short time.

With regard to the diffusion layers SD1 to SD4, it is not necessary to extend the diffusion length, but rather with regard to the diffusion layers SD3 and SD4 each including p-type impurities, it is desirable to perform the second heat treatment for a short time because the above problem of pile-up may be caused.

As described above, it is necessary to form the n-type extension region EX1 before the p-type extension region EX2 and the p-type semiconductor region LDD2 are formed, and it is necessary to diffuse the extension region EX1 by the first heat treatment performed for a long time. In other words, it is necessary to form the p-type extension region EX2 and the p-type semiconductor region LDD2 after the first heat treatment is performed, so as not to be excessively diffused by the first heat treatment performed for a long time. This makes it possible to surely diffuse the n-type extension region EX1 formed in the region 1A to just under the gate electrode G1 without adversely affecting the p-type semiconductor region LDD2 and the p-type extension region EX2.

Further, the diffusion length of the extension region EX1 can be increased by performing the long-time first heat treatment on the extension region EX1, whereby the on-current of the MISFET Q1 can be increased, which will be described in detail with reference to the later-described FIG. 20. Furthermore, a damage, possibly caused by the ion implantation, is recovered by the long-time heat treatment, whereby the on-current can also be increased. Still furthermore, the concentration profile at the end of the extension region EX1 becomes gentler as the diffusion length of the extension region EX1 is increased to a higher level, whereby leakage current due to GIDL can be reduced. Therefore, both the reliability and performance of a semiconductor device can be achieved.

The background of how the present inventors devised the method of manufacturing a semiconductor device according to the present embodiment will be described below as Comparative Examples 1 to 3.

COMPARATIVE EXAMPLE 1

In Comparative Example 1, a semiconductor device of a generation having a gate length of 150 nm or more, in which a high breakdown voltage MISFET and a low breakdown voltage MISFET are formed on the semiconductor substrate SB without using an SOI substrate, is studied.

Figure 17:
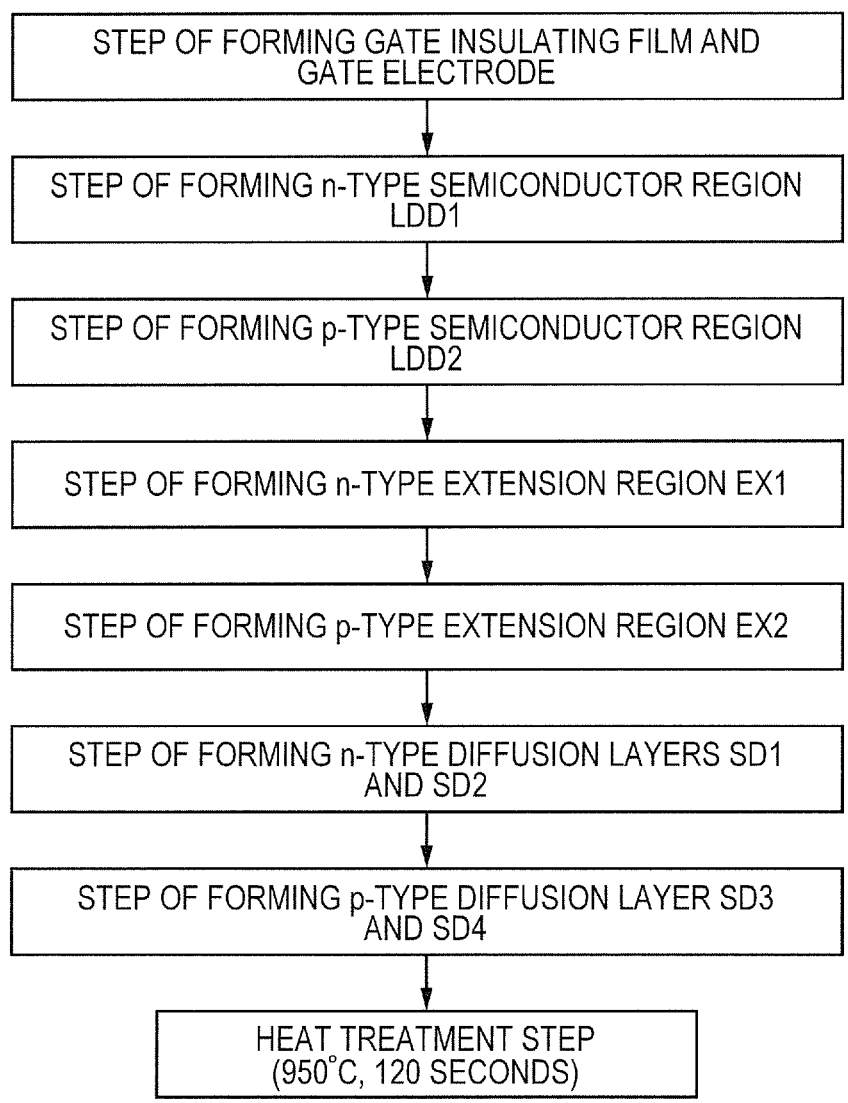
FIG. 17 is a process flow simply showing main steps of manufacturing steps of a semiconductor device of Comparative Example 1.

FIG. 17 briefly summarizes, of a method of manufacturing a semiconductor device of Comparative Example 1, an ion implantation step and a heat treatment step related to the main characteristics of the present embodiment.

First, each of the gate electrodes G1 to G4 is formed as illustrated in FIG. 17. Thereafter, the n-type semiconductor region LDD1, the p-type semiconductor region LDD2, the n-type extension region EX1, the p-type extension region EX2, the n-type diffusion layer SD1, the n-type diffusion layer SD2, the p-type diffusion layer SD3, and the p-type diffusion layer SD4 are sequentially formed by an ion implantation process.

Subsequently, each of the impurity regions is activated and diffused by performing a heat treatment on the semiconductor substrate SB, for example, at 950° C. for 120 seconds. The condition of the heat treatment corresponds to that of the first heat treatment described in the present embodiment.

Because the gate length is large and the thickness of the gate insulating film is also large in the semiconductor device of Comparative Example 1, short-channel characteristics deterioration, problem of pile-up, and the like, which will be described in the later-described Comparative Example 2, are not remarkable. Therefore, the semiconductor device of Comparative Example 1 is manufactured by performing a long-time heat treatment after each of the impurity regions is formed. Therefore, the heat treatment process of Comparative Example 1 cannot be adopted as it is in the semiconductor device of the present embodiment advanced in miniaturization.

COMPARATIVE EXAMPLE 2

In Comparative Example 2, a semiconductor device of a generation having a gate length of, for example, 65 nm to 90 nm, in which a high breakdown voltage MISFET and a low breakdown voltage MISFET are formed on the semiconductor substrate SB without using an SOI substrate, is studied.

Because the gate length in Comparative Example 2 became smaller as compared with Comparative Example 1, the short-channel characteristics of the low breakdown voltage MISFET were remarkably deteriorated. Therefore, the diffusion of impurities was too large if the heat treatment of Comparative Example 1 was adopted, and hence miniaturization was not able to be achieved by the manufacturing method of Comparative Example 1. In addition, in order to improve short-channel characteristics, a structure was adopted in which a halo region including p-type impurities was formed in the channel region under the gate electrode G1. Therefore, the problem of pile-up also became remarkable. Therefore, in order to suppress the diffusion of impurities, TED suppressing annealing, in which a heat treatment can be completed in a short time, is used.

Further, in order to miniaturize the low breakdown voltage MISFET in addition to these situations, it was necessary to form the n-type extension region EX1 and the p-type extension region EX2 so as to be shallower and so as to have a high concentration. Because of this, leakage due to GIDL became a problem.

Figure 18:
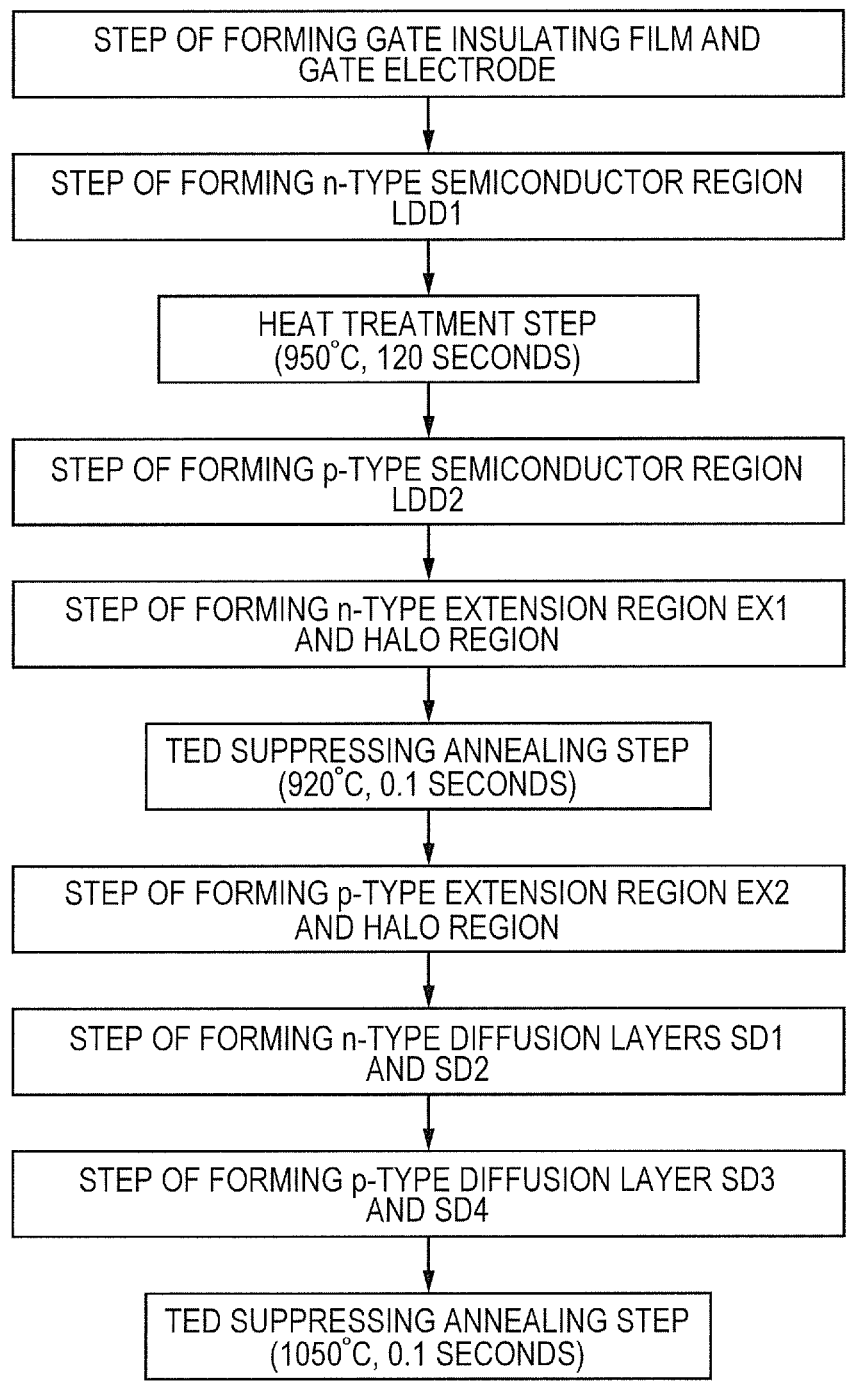
FIG. 18 is a process flow simply showing main steps of manufacturing steps of a semiconductor device of Comparative Example 2.

FIG. 18 briefly summarizes, of a method of manufacturing a semiconductor device of Comparative Example 2, an ion implantation step and a heat treatment step related to the main characteristics of the present embodiment.

First, each of the gate electrodes G1 to G4 is formed as illustrated in FIG. 18. Thereafter, the n-type semiconductor region LDD1 is formed by an ion implantation process. Thereafter, the n-type semiconductor region LDD1 is diffused and activated by performing a heat treatment on the semiconductor substrate SB, for example, at 950° C. for 120 seconds. The condition of the heat treatment corresponds to that of the first heat treatment described in the present embodiment.

Subsequently, the p-type semiconductor region LDD2, the n-type extension region EX1, and the p-type halo region are formed. Herein, the n-type extension region EX1 and the p-type halo region are formed by oblique ion implantation so as to be located under the gate electrode G1. Thereafter, TED suppressing annealing is performed on the semiconductor substrate SB, for example, at 920° C. for 0.1 seconds. The TED suppressing annealing is performed mainly to activate the halo region. By activating the p-type impurities in the halo region once, the position at which the halo region is formed becomes less likely to vary by the subsequent heat treatment.

Subsequently, the p-type extension region EX2, the n-type halo region, the n-type diffusion layer SD1, the n-type diffusion layer SD2, the p-type diffusion layer SD3, and the p-type diffusion layer SD4 are sequentially formed. Thereafter, each of the above impurity regions is activated by performing TED suppressing annealing on the semiconductor substrate SB, for example, at 1050° C. for 0.1 seconds. The condition of the TED suppressing annealing almost corresponds to that of the second heat treatment described in the present embodiment.

In Comparative Example 2, the low breakdown voltage MISFET is formed on the semiconductor substrate SB instead of an SOI substrate, and hence it was important to form the n-type extension region EX1 so as to be shallow. In other words, it was necessary to locate the end of the n-type extension region EX1 just under the gate electrode and to suppress the diffusion, in the depth direction, of the n-type extension region EX1. Therefore, in Comparative Example 2, the position, in the gate length direction, of the n-type extension region EX1 is relatively freely set by oblique ion implantation, and the diffusion in the depth direction is suppressed by the short-time heat treatment.

Therefore, a combination of the oblique ion implantation and the short-time heat treatment was applied to form the n-type extension region EX1 of Comparative Example 2.

On the other hand, in the present embodiment, vertical ion implantation is performed to form the n-type extension region EX1, and hence if the heat treatment process of Comparative Example 2 is adopted, the diffusion length of the n-type extension region EX1 becomes insufficient. Therefore, the heat treatment process of Comparative Example 2 cannot be adopted as it is, in the semiconductor device of the embodiment.

COMPARATIVE EXAMPLE 3

In Comparative Example 3, a semiconductor device of a generation having a gate length of, for example, 65 nm to 90 nm, in which a low breakdown voltage MISFET is formed on an SOI substrate and a high breakdown voltage MISFET is formed on the semiconductor substrate SB, is studied.

The SOI substrate has the semiconductor substrate SB, the insulating layer BX formed on the semiconductor substrate SB, and the semiconductor layer SM formed on the insulating layer BX like the present embodiment. The thickness of the insulating layer BX is approximately 10 to 20 nm, and that of the semiconductor layer SM is approximately 10 to 20 nm. Ion implantation, aimed at adjusting a threshold value or the like, is not performed on the semiconductor layer SM. Therefore, a structure, stronger in terms of short-channel characteristics as compared with Comparative Example 2, is formed, and hence a halo region is not formed in the semiconductor layer SM. Therefore, the heat treatment step for suppressing the variation of a halo region, which was performed in comparative Example 2, became unnecessary.

Figure 19:
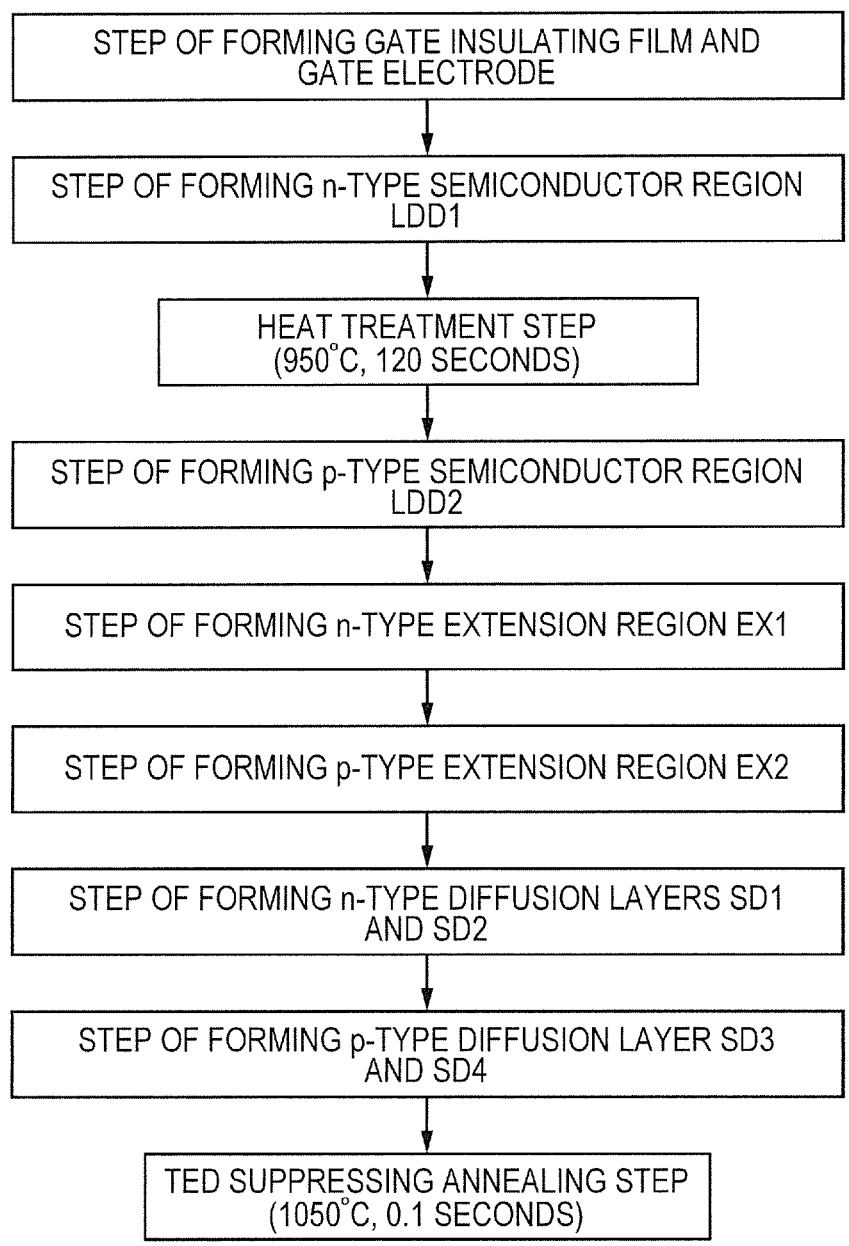
FIG. 19 is a process flow simply showing main steps of manufacturing steps of a semiconductor device of Comparative Example 3.

FIG. 19 briefly summarizes, of a method of manufacturing a semiconductor device of Comparative Example 3, an ion implantation step and a heat treatment step related to the main characteristics of the present embodiment.

First, each of the gate electrodes G1 to G4 is formed as illustrated in FIG. 19. Thereafter, the n-type semiconductor region LDD1 is formed by an ion implantation process. Thereafter, the n-type semiconductor region LDD1 is diffused and activated by performing a heat treatment on the semiconductor substrate SB, for example, at 950° C. for 120 seconds. The condition of the heat treatment corresponds to that of the first heat treatment described in the present embodiment.

Subsequently, the p-type semiconductor region LDD2, the n-type extension region EX1, the p-type extension region EX2, the n-type diffusion layer SD1, the n-type diffusion layer SD2, the p-type diffusion layer SD3, and the p-type diffusion layer SD4 are sequentially formed by an ion implantation process. Thereafter, each of the above impurity regions is activated by performing TED suppressing annealing on the semiconductor substrate SB, for example, at 1050° C. for 0.1 seconds. The condition of the TED suppressing annealing almost corresponds to that of the second heat treatment described in the present embodiment. The problem that the p-type extension region EX2 may be excessively diffused and the problem of pile up can be solved by this TED suppressing annealing.

In the case of using an SOI substrate, the thickness of the semiconductor layer SM is small, and hence the lower surface of the n-type extension region EX1 and that of the n-type diffusion layer SD1 are formed to be in contact with the insulating layer BX. Therefore, junction leakage between the extension region EX1 and the semiconductor substrate SB, which becomes a problem when the MISFET Q1 is formed on the semiconductor substrate SB as in Comparative Examples 1 and 2, does not occur. Therefore, the main problem is leakage current due to GIDL.

Because Comparative Example 3 was developed in a manner that followed the technical background of Comparative Example 2, the concentration of the n-type extension region EX1 was set to be high, and short-time TED suppressing annealing was used as the heat treatment. However, it has been found that the measures for GIDL are insufficient only by following these techniques.

<Detailed Study of Comparative Example 3 and Present Embodiment>

Figure 20:
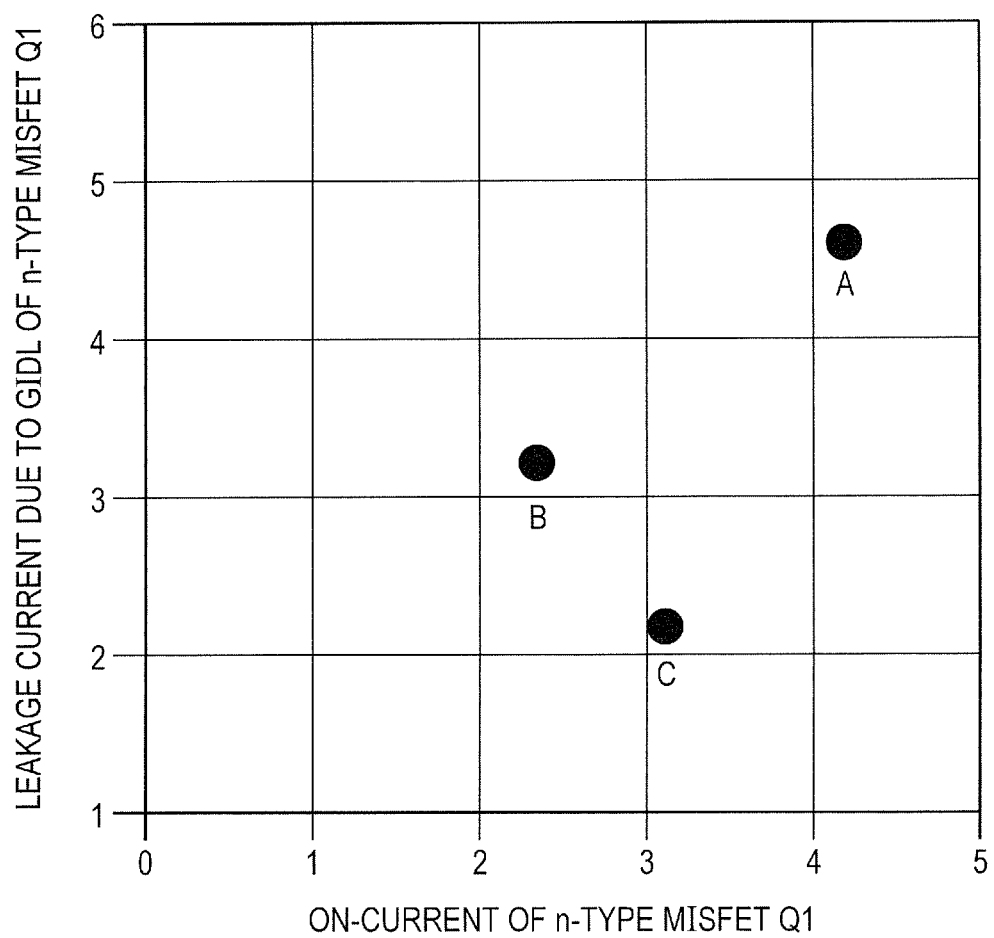
FIG. 20 is a view showing the results of experiments made by the present inventors for the semiconductor devices of the one embodiment and Comparative Example 3.

FIG. 20 shows the results of the experiments made by the present inventors, in which relationships between leakage current due to GIDL and on-current in the low breakdown voltage n-type MISFET Q1 of each of Comparative Example 3 and the present embodiment are shown. The vertical axis represents the magnitude of leakage current due to GIDL, and the horizontal axis represents the magnitude of on-current. The numerical values on the vertical axis and the horizontal axis represent ratios, not measured values.

Points A to C in the view respectively represent results obtained by changing ion implantation conditions and heat treatment condition for the n-type extension region EX1.

Point A represents the conditions of Comparative Example 3, in which a dose amount is set to $2 \times 10^{16}/cm^2$ and a heat treatment condition is set to 1050° C. for 0.1 seconds. Herein, it can be seen that leakage current due to GIDL is high. This is caused due to the fact that oblique ion implantation as in Comparative Example 2, for forming the extension region EX1, cannot be used due to the presence of the epitaxial layer EP and hence vertical ion implantation is used as described above. That is, the extension region EX1 is formed by a combination of the vertical ion implantation and the short-time heat treatment, and hence the end of the extension region EX1 cannot be sufficiently diffused to just under the gate electrode G1.

Point B represents the changed conditions of Comparative Example 3, in which a dose amount is set to $2 \times 10^{14}/cm^2$ and a heat treatment condition is set to 1050° C. for 0.1 seconds. That is, the point B represents conditions in which the dose amount is reduced by approximately one digit, as compared with the point A. When the concentration of the extension region EX1 is lowered in this way, the concentration profile at the end of the extension region EX1 becomes gentle, and hence leakage current due to GIDL decreases, but on-current also decreases, and hence the performance of the MISFET Q1 is deteriorated.

Point C represents the conditions of the present embodiment, in which a dose amount is set to $2 \times 10^{14}/cm^2$ and a heat treatment condition is set to 950° C. for 120 seconds. That is, Point C represents conditions in which the time of the heat treatment is greatly extended as compared with Point B, so that leakage current due to GIDL is further reduced and on-current is increased.

The reason for this is considered as follows: because the diffusion length of the extension region EX1 was able to be increased by extending the time of the heat treatment, the on-current increased due to a reduction in the effective channel length of the MISFET Q1. In addition, it is considered that the on-current increased also due to the fact that the damage caused by ion implantation was recovered by the long-time heat treatment.

It can be considered that as the diffusion length of the extension region EX1 became larger, the concentration profile at the end of the extension region EX1 became gentler as compared with Point B, so that leakage current due to GIDL was reduced.

In addition, because the thickness of the semiconductor layer SM is small in the semiconductor device according to the present embodiment, the lower surface of the n-type extension region EX1 is formed to be in contact with the insulating layer BX. Therefore, even if a long-time heat treatment is performed on the extension region EX1, there is no need to consider junction leakage between the extension region EX1 and the semiconductor substrate SB, which may be a problem in a semiconductor device not using an SOI substrate as in Comparative Examples 1 and 2.

Further, the heat treatment for the extension region EX1 can be performed simultaneously with the heat treatment for the semiconductor region LDD1 in the present embodiment, and hence there is no need to add a manufacturing step, as compared with Comparative Example 3.

It has been found as described above that in the method of manufacturing a semiconductor device according to the present embodiment, both the reliability and performance of a semiconductor device can be achieved without adding a manufacturing step, as compared with Comparative Example 3.

It is also found that the method of manufacturing a semiconductor device according to the present embodiment is different from those of Comparative Examples 1 to 3 and the idea of the present embodiment is also different from those of Comparative Examples 1 to 3. That is, a problem can be solved in the method of manufacturing a semiconductor device according to the embodiment, the problem being noticed for the first time when a semiconductor element, such as the MISFET Q1, is formed on an SOI substrate and when a fine semiconductor element having a gate length of, for example, 90 nm or less is considered.

The invention made by the present inventors has been specifically described above based on its preferred embodiments, but it is needless to say that the invention should not be limited to the embodiments and may be modified variously within a range not departing from the gist thereof.

What is claimed is:

1. A method of manufacturing a semiconductor device, comprising the steps of:
    (a) providing a semiconductor substrate, an insulating layer formed on the semiconductor substrate, and a first semiconductor layer formed on the insulating layer;
    (b) removing the insulating layer in a second region and the first semiconductor layer in the second region, while leaving the insulating layer in a first region and the first semiconductor layer in the first region, wherein the second region in which a second MISFET is to be formed is a different region from the first region in which a first MISFET is to be formed;
    (c) after the step (b), forming a first gate electrode of the first MISFET on the first semiconductor layer in the first region via a first gate insulating film, and forming a second gate electrode of the second MISFET on the semiconductor substrate in the second region via a second gate insulating film;
    (d) after the step (c), forming a first semiconductor region having an n-type conductivity in the semiconductor substrate in the second region by an ion implantation process;

(e) after the step (c), forming a first extension region having an n-type conductivity in the first semiconductor layer in the first region by an ion implantation process;

(f) after the steps (d) and (e), performing a first heat treatment on the semiconductor substrate;

(g) after the step (f), forming a second a diffusion layer, having a higher concentration than the first semiconductor region and having an n-type conductivity, in the semiconductor substrate in the second region by an ion implantation process;

(h) after the step (f), forming a first diffusion layer, having a higher concentration than the first extension region and having an n-type conductivity, in the first semiconductor layer in the first region by an ion implantation process; and (i) after the steps (g) and (h), performing a second heat treatment on the semiconductor substrate, wherein a time for which the first heat treatment is performed is longer than a time for which the second heat treatment is performed.

2. The method according to claim 1,
wherein, after the step (c) and before the step (e), a second semiconductor layer is formed on the first semiconductor layer in the first region, and
wherein the ion implantation process in the step (e) is performed at an angle perpendicular to the semiconductor substrate or an angle inclined in a range of 10° or less with respect to a perpendicular to the semiconductor substrate.

3. The method according to claim 2,
wherein, after the step (c) and before the step (d), the second semiconductor layer is not formed on the semiconductor substrate in the second region, and
wherein the ion implantation process in the step (d) is performed at an angle larger than the angle used in the step (e).

4. The method according to claim 2,
wherein an impurity is not introduced into the first semiconductor layer by an ion implantation process before the second semiconductor layer is formed on the first semiconductor layer.

5. The method according to claim 1,
wherein the first extension region is formed of an impurity including arsenic, and
wherein the arsenic is diffused in a range ranging from 2 nm or more to 10 nm or less in the first semiconductor layer by the first heat treatment.

6. The method according to claim 1,
wherein the first heat treatment is performed at 900° C. or higher and for 100 seconds or more, and
wherein the second heat treatment is performed at 900° C. or higher and for 1 second or less.

7. The method according to claim 1,
wherein a gate length of the first MISFET is 90 nm or less, and
wherein a gate length of the second MISFET is larger than the gate length of the first MISFET.

8. The method according to claim 1,
wherein the steps (g) and (h) are performed at the same time.

9. The method according to claim 1,
wherein the steps (g) and (h) are performed as steps different from each other.

10. The method according to claim 1,
wherein, in the step (b), the insulating layer in a fourth region and the first semiconductor layer in the fourth region are removed, while the insulating layer in a third region and the first semiconductor layer in the third region are left, wherein the third region in which a third MISFET is to be formed is a different region from the first region, and wherein the fourth region in which a fourth MISFET is to be formed is a different region from the second region,
wherein, in the step (c), a third gate electrode of the third MISFET is formed on the first semiconductor layer in the third region via a third gate insulating film, and a fourth gate electrode of the fourth MISFET is formed on the semiconductor substrate in the fourth region via a fourth gate insulating film, and
wherein, after the step (f) and before the step (i), the method further comprises the steps of:
(j) in the fourth region, forming a second semiconductor region having a p-type conductivity in the semiconductor substrate by an ion implantation process;
(k) in the third region, forming a second extension region having a p-type conductivity in the first semiconductor layer by an ion implantation process;
(l) in the fourth region, forming a fourth diffusion layer, having a higher concentration than the second semiconductor region and having a p-type conductivity, in the semiconductor substrate by an ion implantation process; and
(m) in the third region, forming a third diffusion layer, having a higher concentration than the second extension region and having a p-type conductivity, in the first semiconductor layer by an ion implantation process.

11. The method according to claim 10,
wherein, after the step (c) and before the step (e) a second semiconductor layer is formed on the first semiconductor layer in the third region, and
wherein the ion implantation process in the step (k) is performed at an angle perpendicular to the semiconductor substrate or an angle inclined in a range of 10° or less with respect to a perpendicular to the semiconductor substrate.

12. The method according to claim 11,
wherein, after the step (c) and before the step (d) the second semiconductor layer is not formed on the semiconductor substrate in the fourth region, and
wherein the ion implantation process in the step (j) is performed at an angle larger than the angle used in the step (k).

13. The method according to claim 11,
wherein an impurity is not introduced into the first semiconductor layer by an ion implantation process before the second semiconductor layer is formed on the first semiconductor layer.

14. The method according to claim 10,
wherein the first heat treatment is performed at 900° C. or higher and for 100 seconds or more, and
wherein the second heat treatment is performed at 900° C. or higher and for 1 second or less.

15. The method according to claim 10,
wherein a gate length of each of the first and third MISFETs is 90 nm or less, and
wherein a gate length of each of the second and fourth MISFETs is larger than the gate length of each of the first and third MISFETs.

* * * * *